United States Patent
Tyminski et al.

(10) Patent No.: US 9,753,363 B2
(45) Date of Patent: Sep. 5, 2017

(54) SCANNER BASED OPTICAL PROXIMITY CORRECTION SYSTEM AND METHOD OF USE

(71) Applicants: NIKON CORPORATION, Tokyo (JP); NIKON PRECISION INC., Belmont, CA (US)

(72) Inventors: Jacek Tyminski, Mountain View, CA (US); Raluca Popescu, San Mateo, CA (US); Tomoyuki Matsuyama, Saitama (JP)

(73) Assignees: NIKON CORPORATION, Tokyo (JP); NIKON PRECISION INC, Belmont, CA (US)

(*) Notice: Subject to any disclaimer, the term of this patent is extended or adjusted under 35 U.S.C. 154(b) by 0 days.

(21) Appl. No.: 15/041,312

(22) Filed: Feb. 11, 2016

(65) Prior Publication Data
US 2016/0161842 A1 Jun. 9, 2016

Related U.S. Application Data

(62) Division of application No. 13/721,910, filed on Dec. 20, 2012, now Pat. No. 9,286,416, which is a division
(Continued)

(51) Int. Cl.
G06F 17/50 (2006.01)
G03F 1/36 (2012.01)
(Continued)

(52) U.S. Cl.
CPC ............... *G03F 1/36* (2013.01); *G03F 1/144* (2013.01); *G03F 1/68* (2013.01); *G06F 17/50* (2013.01); *G06F 17/5081* (2013.01)

(58) Field of Classification Search
CPC ..................................................... G06F 17/50
(Continued)

(56) References Cited

U.S. PATENT DOCUMENTS 6,745,372 B2 6/2004 Côté et al.
6,782,525 B2 8/2004 Garza et al.
(Continued)

FOREIGN PATENT DOCUMENTS

EP 1560073 3/2005
JP 2002351931 12/2002
(Continued)

OTHER PUBLICATIONS

Oka, M. et al., "Robust OPC technique using aerial image parameter", Photomask and Next-Generation . . . Mask Technology XIII, Proc. of SPIE vol. 6283, 2006, 9 pages.
(Continued)

*Primary Examiner* — Thuan Do
(74) *Attorney, Agent, or Firm* — Andrew M. Calderon; Roberts Mlotkowski Safran Cole & Calderon, P.C.

(57) ABSTRACT

A modeling technique is provided. The modeling technique includes inputting tool parameters into a model and inputting basic model parameters into the model. The technique further includes generating a simulated, corrected reticle design using the tool parameters and the basic model parameters. An image of test patterns is compared against the simulated, corrected reticle design. A determination is made as to whether $\delta_1 < \epsilon_1$, wherein $\delta_1$ represents model vs. exposure difference and $\epsilon_1$ represents predetermined criteria. The technique further includes completing the model when $\delta_1 < \epsilon_1$.

22 Claims, 15 Drawing Sheets

Related U.S. Application Data of application No. 12/521,651, filed as application No. PCT/US2008/051146 on Jan. 16, 2008, now Pat. No. 8,365,107.

(60) Provisional application No. 60/885,547, filed on Jan. 18, 2007.

(51) Int. Cl.
*G03F 1/00* (2012.01)
*G03F 1/68* (2012.01)

(58) Field of Classification Search
USPC .......................................................... 716/53
See application file for complete search history.

(56) References Cited

U.S. PATENT DOCUMENTS

| | | | |
|---|---|---|---|
| 6,792,592 | B2 | 9/2004 | Keogan et al. |
| 6,846,617 | B2 | 1/2005 | Pierrat |
| 7,003,758 | B2 | 2/2006 | Ye et al. |
| 7,030,997 | B2 | 4/2006 | Neureuther et al. |
| 7,093,226 | B2 | 8/2006 | Pang |
| 7,114,145 | B2 | 9/2006 | Ye et al. |
| 7,116,411 | B2 | 10/2006 | Park et al. |
| 7,117,478 | B2 | 10/2006 | Ye et al. |
| 7,120,895 | B2 | 10/2006 | Ye et al. |
| 7,642,019 | B2 | 1/2010 | Kim |
| 7,873,204 | B2 | 1/2011 | Wihl et al. |
| 8,151,220 | B2 | 4/2012 | Hess et al. |
| 2003/0088847 | A1 | 5/2003 | Chang et al. |
| 2003/0237064 | A1 | 12/2003 | White et al. |
| 2005/0149902 | A1 | 7/2005 | Shi et al. |
| 2005/0204322 | A1 | 9/2005 | Kotani et al. |
| 2005/0240895 | A1 | 10/2005 | Smith et al. |
| 2006/0062445 | A1* | 3/2006 | Verma ................ G06F 17/5068 382/144 |

FOREIGN PATENT DOCUMENTS

| | | |
|---|---|---|
| JP | 2005148176 | 6/2005 |
| JP | 2005181524 | 7/2005 |
| JP | 2005189362 | 7/2005 |
| JP | 2006313353 | 11/2006 |
| JP | 2006313815 | 11/2006 |
| JP | 2007225924 | 9/2007 |
| JP | 2010515952 | 5/2010 |
| WO | 2004008246 | 1/2004 |
| WO | 2005082063 | 9/2005 |
| WO | 2005103819 | 11/2005 |

OTHER PUBLICATIONS

Jung, S. et al, "Improving Model-Based OPC Performance for sub-60nm devices Using real source optical model", Design and Process Integration for . . . Manufacturing, 2006, 6 pages.
Ahn, J. et al., "Effect of Lens Aberrations on OPC Model Accuracy for Low k1 Lithography Process", Optical Microlithography XIX, Proc. of SPIE vol. 6154, 2006, 10 pages.
Dusa, M. et al., "An integrated lithography concept with application on 45nm ½ pitch memory devices", Optical Microlithography XIX, Proc. of SPE vol. 6154, 2006, 12 pages.
Van De Kerhof, M. et al., "Full optical column characterization of DUV lithographic projection tools", Optical Microlithography XVII, Proceedings of SPIE vol. 5377, 2004, 11 pages.
Nikolsky et al., "OPC Cycle Time Reduction and Accuracy Improvement by Early Access to Advanced Tachyon Modeling of Twinscan XT:1900I Scanner", SPIE vol. 7122, Photomask Technology, Oct. 17, 2008, 11 pages.
International Search Report for corresponding Application No. PCT/US2008/051146, date of issuance—Jul. 21, 2009, in parent U.S. Appl. No. 12/521,651, 1 page.
Kallingal, C. et al., "Correlation Between OPC Model Accuracy and Image Parameters", Photomask Technology 2006, Proc. of SPIE vol. 6349, in parent U.S. Appl. No. 12/521,651, 9 pages.
Abdo, A. et al., "The effect of OPC optical and resist model parameters on the model accuracy, run time, and stability", Photomask Technology 2006, Proc. of SPIE vol. 6349, in parent U.S. Appl. No. 12/521,651, 9 pages.
Saied, M. et al., "Sensitivity of a variable threshold model towards process and modeling parameters", Photomask Technology 2006, Proc. of SPIE vol. 6349, in parent U.S. Appl. No. 12/521,651, 10 pages.
Depre, L. et al., "Accounting for Lens aberrations in OPC model calibration", Photomask Technology 2006, Proc. of SPIE, vol. 6349, 2006, in parent U.S. Appl. No. 12/521,651, 9 pages.
McIntyre, G. R. et al., "Screening Layouts for High-NA and Polarization Effects Using Pattern Matching", p. 1-20, EIPBN Manuscript # P14.2, 2005, 20 pages.
Kahng, A. B. et al., "Lens Aberration Aware Placement for Timing Yield", p. 1-17, Jan. 2009, 17 pages.
Zhang, Y. et al., "A Focus Exposure Matrix Model for Full Chip Lithography Manufacturability Check and Optical Proximity Correction", Photmask and . . . Lithography, 2006, 13 pages.
Sturtevant, J. et al. "Assessing the impact of real world manufacturing lithography variations on post-OPC CD control", in Proceedings of SPIE, vol. 5756, May 2005, p. 240-254, 15 pages.
Office Action dated Dec. 19, 2014 in corresponding Korean Application No. KR10-2009-7015891, 8 pages.
Japanese Patent Office Action for JP-2009546490, May 8, 2012, in parent U.S. Appl. No. 12/521,651, 7 pages.

\* cited by examiner

| Generation | 1990 | 1995 | 2000 | 2005 | 2007 |
|---|---|---|---|---|---|
| k1 | ~0.7 | ~0.5 | ~0.35 | ~0.3 | < 0.3 |
| Reticle solusion | N/A | Iso/Dense Bias | I/D Bias SRAF OPC | I/D Bias SRAF OPC DFM | I/D Bias SRAF OPC DFM |
| Minimum CD [nm] | 400 | 250 | 130 | 65 | 45 |

Optical image

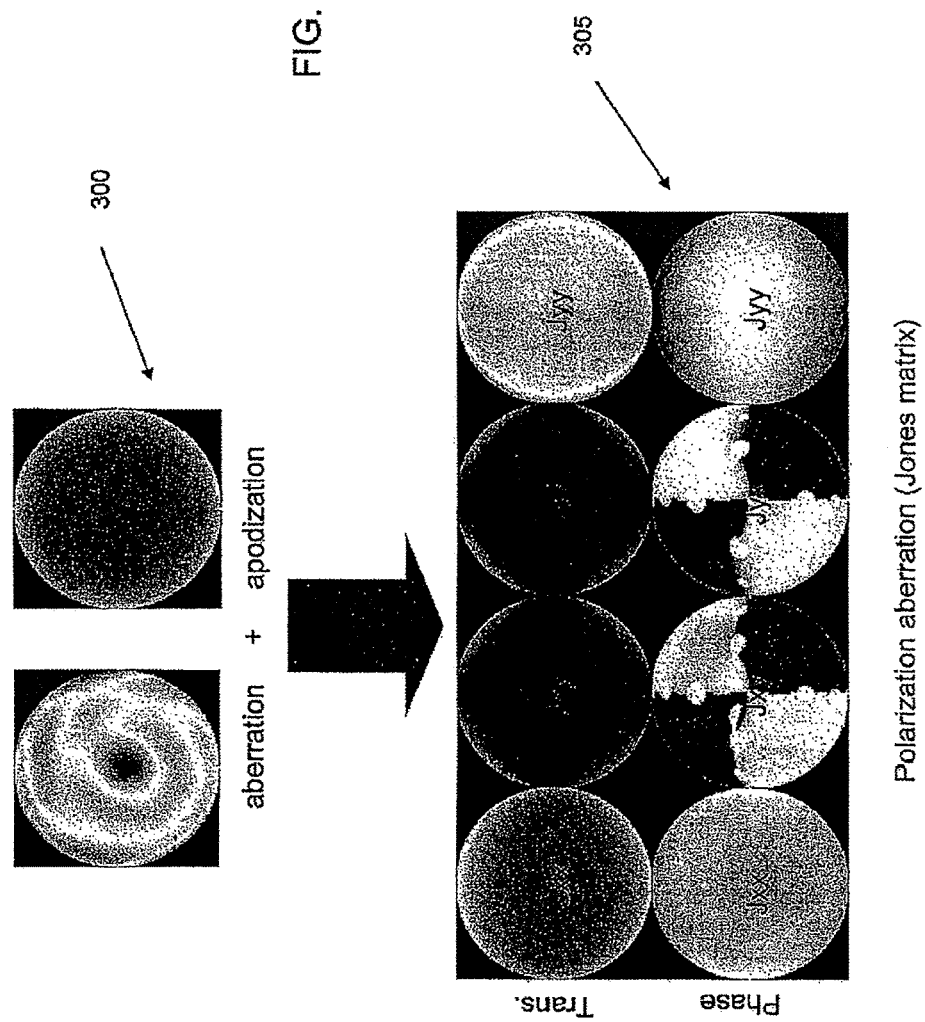

δ: Model vs. exposure difference
ε: Criteria

SCANNER BASED OPTICAL PROXIMITY CORRECTION SYSTEM AND METHOD OF USE

CROSS REFERENCE TO RELATED APPLICATIONS

The present application is a Divisional of U.S. application Ser. No. 13/721,910, filed Dec. 20, 2012, which is a Divisional of U.S. application Ser. No. 12/521,651, filed Jun. 29, 2009, which is a national stage of PCT/US2008/051146, filed Jan. 16, 2008, which claims priority under 35 U.S.C. §119 to U.S. Provisional Application No. 60/885,547, filed on Jan. 18, 2007, the contents of which are herein incorporated by reference in their entirety.

FIELD OF THE INVENTION

The invention generally relates to an optical proximity correction (OPC) system and method of use and, more particularly to modeling techniques used for scanner based reticle designs.

BACKGROUND OF THE INVENTION

Semiconductor manufacturing is limited by the lithography process, which prints increasingly finer circuit patterns. In turn, the lithography process is driven by two technologies: wafer lithography equipment and computational lithography. Historically, wafer lithography and computational lithography have been separate and independent processes, each attempting to optimize the lithography process to produce finer circuit patterns.

In the current generation of microelectronics it has become increasingly more difficult to produce finer circuit patterns. For example, feature size, line width, and the separation between features and lines are becoming increasingly smaller and more difficult to produce in newer generation technologies, e.g., 45 nm technologies. One of the fundamental reasons for these difficulties is that imaging of integrated circuit (IC) patterns has become prone to optical proximity effects (OPEs) modifying the images in a interdependent manner where any pattern interacts with imaging of its neighbors. To keep up with the need for such finer circuit patterns, Optical Proximity Corrections (OPC) processes have been used to improve image fidelity. The goal of the OPC is to correct OPEs, which cause deterioration of image fidelity of patterns used in IC manufacture. However, the accuracy of OPC models have not kept pace with the requirements for finer circuit patterns, leading to higher manufacturing costs, increased time to market and decreased quality in manufacturing. Basically, the OPC models used thus far are incomplete because they do not include all the factors impacting OPEs.

Basically, the OPC process is governed by a set of optical rules, a set of modeling principles or a hybrid combination of rule-based OPC and model-based OPC. In general, current OPC techniques involve setting up an OPC software program with accompanying OPC scripts to produce OPC rules for rule-based OPC, or OPC models for model-based OPC. The OPC program carries out computer corrections of initial data set with information relating to the desired pattern and manipulates the data set to arrive at a corrected data set. This data set is then used to design a reticle used to manufacture the circuit patterns on a wafer.

However, manipulating the data to arrive at a corrected data set is a time consuming process, requiring an iterative process. This iterative process includes constantly modifying the OPC model setup or OPC rules to arrive at a desirable OPC model. Typically, this is an intensively manual process, requiring best guesses and estimations. For example, during OPC model iterations, OPC engineers try to guess how to compensate for incompleteness of the OPC model. This is time consuming and prone to errors and/or omissions.

Accordingly, there exists a need in the art to overcome the deficiencies and limitations described hereinabove.

SUMMARY OF THE INVENTION

In a first aspect of the invention, a modeling technique is provided. The modeling technique includes inputting tool parameters into a model and inputting basic model parameters into the model. The technique further includes generating a simulated, corrected reticle design using the tool parameters and the basic model parameters. An image of test patterns is compared against the simulated, corrected reticle design. A determination is made as to whether $\delta_1 < \epsilon_1$, wherein $\delta_1$ represents model vs. exposure difference and $\epsilon_1$ represents predetermined criteria. The technique further includes completing the model when $\delta_1 < \epsilon_1$.

In another aspect of the invention, a system is provided for deploying an application for modeling a design layout. The system includes a computer infrastructure operable to: generate a simulated, corrected reticle design using tool parameters and basic model parameters; compare an image of test patterns against the simulated, corrected reticle design; compare model vs. exposure difference with predetermined criteria; and complete the model when the model vs. exposure difference is less than the predetermined criteria.

In still a further aspect of the invention, an exposure apparatus is provided. The exposure apparatus comprises at least one module configured to: generate a simulated, corrected reticle design using tool parameters and basic model parameters; compare an image of test patterns against the simulated, corrected reticle design; compare model vs. exposure difference with predetermined criteria; and complete the model when the model vs. exposure difference is less than the predetermined criteria.

In yet another aspect of the invention, a method is provided for providing a model. The method includes generating a simulated, corrected reticle design using tool parameters and basic model parameters, and comparing an image of test patterns against the simulated, corrected reticle design. The method further includes iteratively comparing model vs. exposure difference and predetermined criteria, and changing at least one of tool parameters and basic model parameters until the model vs. exposure difference is less than the predetermined criteria in the comparing.

In still a further aspect of the invention, a computer program product comprises a computer usable medium having readable program code embodied in the medium, and the computer program product includes at least one component to: generate a simulated, corrected reticle design using tool parameters and basic model parameters; and iteratively changing at least one of the tool parameters and basic model parameters and compare model vs. exposure difference with predetermined criteria until the model vs. exposure difference is less than the predetermined criteria.

In a further aspect of the invention, a method of making a reticle and semiconductor device comprises: modifying a simulated, corrected reticle design using basic model parameters and tool parameters of a predetermined projection tool;

creating reticle design data which represents a design of layouts to be imaged for the semiconductor device; and creating a mask set by comparing the simulated, corrected reticle design and the reticle design data.

In still another embodiment, an OPC design process includes providing scanner parameters of a predetermined projection tool to a software provider; importing the scanner parameters into a software product for making a design of reticles; and providing the software to a semiconductor device maker for use in the design of the reticles.

BRIEF DESCRIPTION OF THE DRAWINGS

The present invention is described in the detailed description which follows, in reference to the noted plurality of drawings by way of non-limiting examples of exemplary embodiments of the present invention.

FIG. 3 shows projector lens related parameters which may be used in the modeling technique in accordance with the invention;

DETAILED DESCRIPTION OF EMBODIMENTS OF THE INVENTION

The invention generally relates to a scanner based optical proximity correction (OPC) system and method of use. In embodiments, the present invention utilizes lithography simulation and OPC models to improve critical dimension (CD) performance of integrated circuits. In preferred embodiments, the OPC models implementing the techniques described herein will improve CD performance of integrated circuits for 45 nm CD and below. The present invention can be implemented for any tool such as a scanner or a full field stepper.

To achieve nanometer level CD control with fast turn-around time, the system and method of the invention uses more than just traditional input parameters such as lithography dose, defocus, light source type and lens parameters. For example, the simulation and modeling inputs of the invention include immersion effects, spectral bandwidth and chromatic aberrations, polarization impacts, global and local flare, wavefront aberrations, scan synchronization effects, and/or other parameters that may impact CD performance, as discussed herein. These parameters can be determined for each tool generation, or any individual tool, to increase its overall efficiency in predicting accuracy of features pattered during integrated circuit manufacture.

Figure 1:
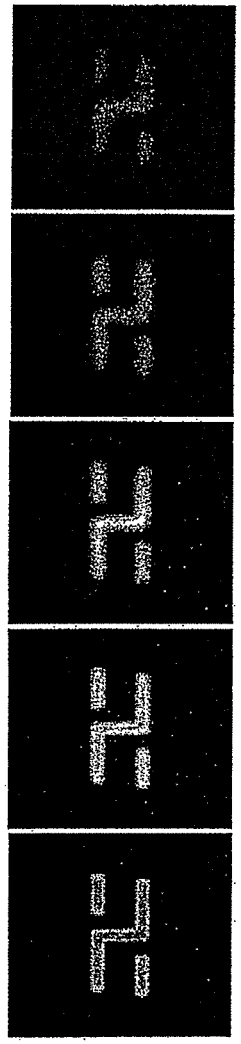
FIG. 1 shows a graph of k1 trend versus reticle design solutions for five generations of integrated circuits.

By way of comparison, FIG. 1 shows k1 trend versus reticle design solutions for five generations of CD over a 17 year period. These generations include a 400 nm CD (1990), 250 nm CD (1995), 130 nm CD (2000), 65 nm CD (2005) and 45 nm CD (2007). As should be understood by those of skill in the art, k1 represents the coefficient of how difficult it becomes to image an integrated circuit. As shown in FIG. 1, as the optical image becomes smaller, the more difficult it becomes to image the smaller features, e.g., lines, spaces, holes, posts and other features of the integrated circuit layout. This is exemplified by the less pronounced lines, e.g., "fuzzy" or less sharp lines, in each successive generation.

To compensate for the difficulty in controlling imaging of smaller features, e.g., due to the reduction in the k1 value, methods have been introduced which mitigate the problem of the reduction of the k1 value. For example, in the 400 nm CD generation, no specific technique was required to mitigate the problems associated with the reduction in k1. In the 250 nm CD generation, though, a feature biasing was introduced into the patterning and pattern modeling techniques. Its role was to correct for the optical proximity effect resulting in bias between isolated and dense features. However, by the 130 nm generation, feature modeling was not able to adequately compensate for the difficulty in imaging smaller feature sizes. As such, non-printable sub-resolution assist features, (SRAF) were introduced into the patterning to mitigate the problems associated with the reduction in k1. Similarly, by the 65 nm CD generation, feature modeling and non-printable sub-resolution assist features, were not able to adequately compensate for the difficulty in imaging smaller feature sizes. As such, design for manufacturing (DFM) was introduced into the modeling to mitigate the problems associated with the reduction in k1. DFM is a set of techniques automating a wide of range of IC design layout modifications aiming at improving fidelity of the patterned images. OPC is a key element of DFM.

In the current CD generation equal to 45 nm and less, prior to the introduction of the current techniques, only data associated with illuminator layout, numerical aperture, feature biasing, and non-printable sub-resolution assist features, (SRAF) were used in DFM to mitigate the problems in the reduction in k1. However, it has been found that such data is not adequate to mitigate the problems in the reduction in k1. As such, the present invention provides a solution by introducing additional parameters into the OPC modeling techniques, none of which were previously considered by those of skill in the art.

More specifically, the present invention increases reticle design related yield, decreases design and manufacturing costs, as well as IC time to market, and provides more accurate and faster OPC design by incorporating scanner design information and actual imaging tool performance information into the reticle design modeling. The present invention is beneficial to any CD generation, with greatest applicability when the k1 is less than approximately 0.3.

In embodiments, the newly introduced parameters of the modeling provide more robust IC layout designs, where the imaging is more vulnerable to statistical and deterministic errors, relative to previous generations. These parameters can be introduced for any tool, or tool generation, thereby providing tool-specific or tool type-specific, customized OPC and OPC verification models. The tool may be, for example, scanners or full field steppers. In embodiments, the system and method of the invention uses the following preferred parameters in the modeling of the reticle design:

Illuminator details such as, for example, intensity distribution and polarization signature across the pupil (polarization status);

Lens signature as defined in terms of Jones Matrix Map or any other representation of phase, amplitude and polarization transformations in the lens;

Flare data, including global flare and local flare;

Longitudinal chromatic aberrations;

Illuminator spectrum;

Transverse synchronization errors; and

Longitudinal synchronization errors.

Illuminator signature contains information about intensity and polarization content of each location in the illuminator pupil. The Jones Matrix Map contains information about phase, amplitude and polarization transformations taking place in the lens of the tool. These transformations represent the following:

Wavefront aberration: Wavefront aberration refers to distortions of constant phase plane of waves propagating through the projection lens. It is important to note that conventional wavefront aberration techniques are indifferent to polarization, so the polarization properties and transformations of the wave have been ignored in the past;

Apodization: Apodization represents a change the output intensity profile of an optical system, and is a complicated function controlled by certain properties of the lens. Apodization typically refers to a non-uniform transmission profile that approaches zero at the edges of the lens pupil;

Polarization transformations taking place between various polarization states propagating through the lens.

In embodiments, the Jones Matrix Map will be defined for each lens in the projection system; although, in alternative embodiments the Jones Matrix Map can be defined for certain relevant lens in the tool.

The flare data, which comprises local flare and global flare, is stray light, which contributes to the deterioration of quality of the image. Flare typically originates in the lens, though other sources can also contribute to the flare. Global flare is independent of the image dimensions while local flare is dependent on the sizes of the images. Those of skill in the art are capable of measuring the flare data, which can now be incorporated into the modeling of the present invention.

As to the longitudinal chromatic aberrations, different colors from the illuminator will form images slightly offset from one another. How much of an offset there is for each of the different colors is characterized by the longitudinal chromatic aberrations of the lens. Illuminator spectrum data takes into account all of the colors used in the projection system including the intensity distribution versus wavelength, not just a simple approach of conventional systems which assume that the illumination is monochromatic.

In scanners, transverse and longitudinal synchronization errors, characterized by their moving standard deviations (MSDs), account for the errors in movement between the reticle and wafer during image formation. For example, as those of skill in the art will appreciate, both the reticle and the wafer are moved during the imaging of an integrated circuit in order to expose the entire IC pattern image on the wafer. This movement of the reticle and the wafer has to be very accurately synchronized. However, the movement of both the reticle and the wafer can introduce synchronization errors resulting in imaging errors and, as such, it is important to account for the synchronization errors to accurately predict their impact on imaging of the reticle on the wafer. Thus, in the present invention, the modeling techniques take into account the scanner synchronization errors of both the reticle and the wafer in order to more accurately predict the reticle imaging on the wafer. In general, the use of interferometric techniques can be used to capture the synchronization errors.

In further embodiments, the system and method of the invention can use other parameters or alternative parameters in the modeling technique of the present invention. For example, the present invention also contemplates the following parameters:

Numerical Aperture (NA) error: NA of an optical system is a dimensionless number that characterizes the range of angles over which the system can accept or emit light;

Sigma error: Sigma error is the illumination set up error; and/or

Thermal Aberration: Thermal Aberration refers to an effect that causes light from one point of an object, after transmission through the system to arrive at a point different than predicted for the light propagating through a lens without thermal aberrations, based on thermal conditions of the lens as it is exposed to light. Thermal aberrations are caused by non-uniform heating of the lens during optical system operation.

It is also contemplated that field-dependent signature can be introduced, in embodiments.

Thus, by using the above parameters in the modeling technique of the present invention, it is now possible to improve accuracy and increase speed of the modeling process. More specifically, it is advantageously possible to:

Improve the physical model quality in the model setting process;

Provide a more accurate, model based OPC;

Provide fast conversion of reticle design with OPE (Optical Proximity Effect) to test exposure;

Provide preliminary OPC based on tool design data without OPE test exposure; and Provide less number of reticle design iteration cycles.

Figure 2:
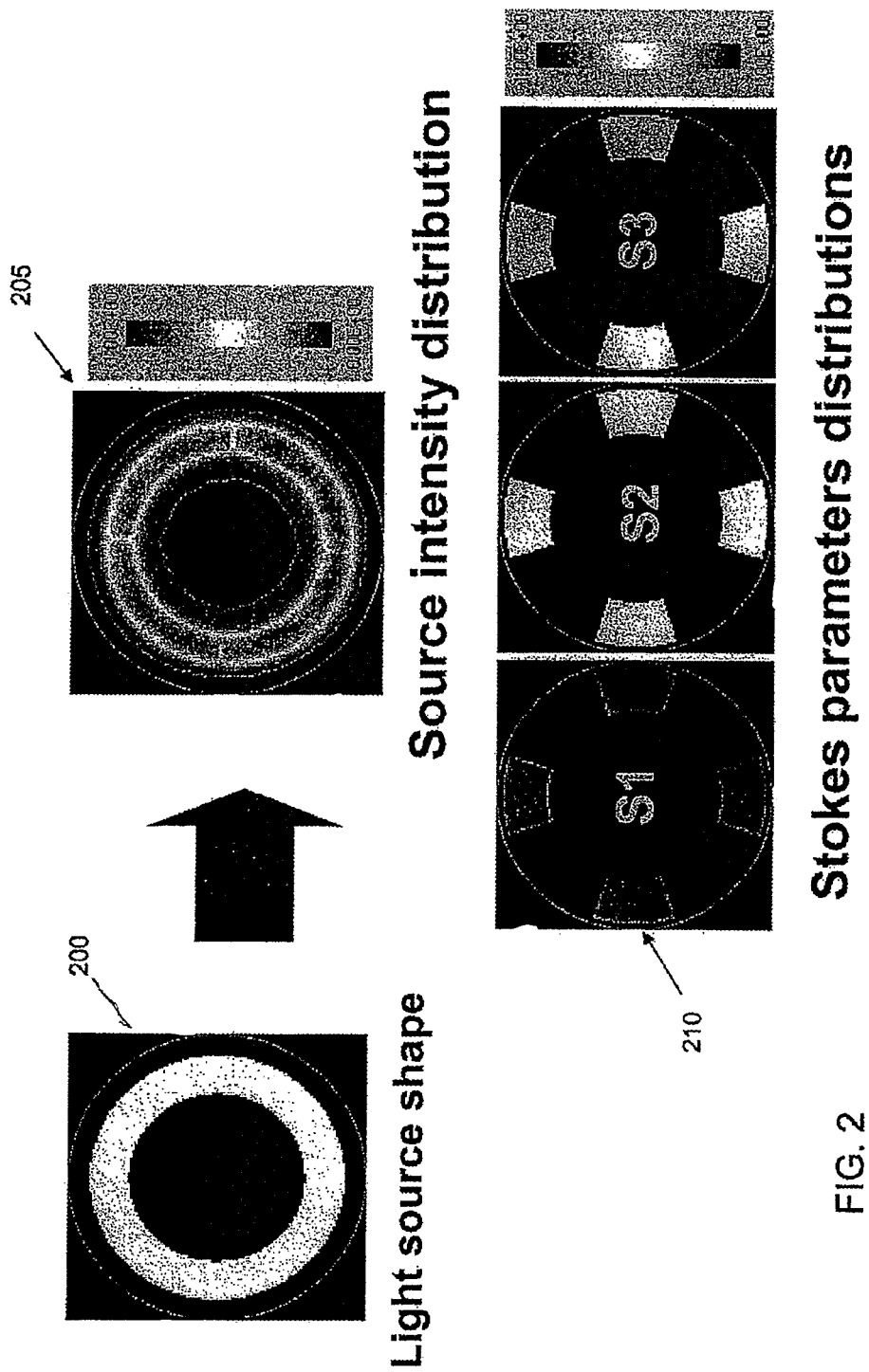
FIG. 2 shows illuminator related parameters which may be used in the modeling technique in accordance with the invention.

FIG. 2 shows illuminator related parameters which may be used in the model in accordance with the invention. More specifically, source intensity distribution and Stokes parameters distribution, or any other form of illuminator polarization signature may be used in the modeling techniques of the present invention. By way of illustration, FIG. 2 shows a light source shape for an annular illuminator 200. As seen, the annular illuminator has a source intensity distribution 205 that varies about the illuminator. The source intensity distribution appears most intense in the middle of the light source layout with the edges being less intense. FIG. 2 further shows the Stokes parameters distribution 210. Those of skill in the art understand that the Stokes parameters are a set of values that describe the polarization state of electromagnetic radiation.

FIG. 3 shows projector lens related parameters which may be used in the model in accordance with the invention. More specifically, FIG. 3 shows scalar, polarization independent aberration and apodization of a lens 300, in addition to the lens Jones Matrix Map 305. Again, these parameters may be used in the modeling technique of the present invention.

Figure 4A:
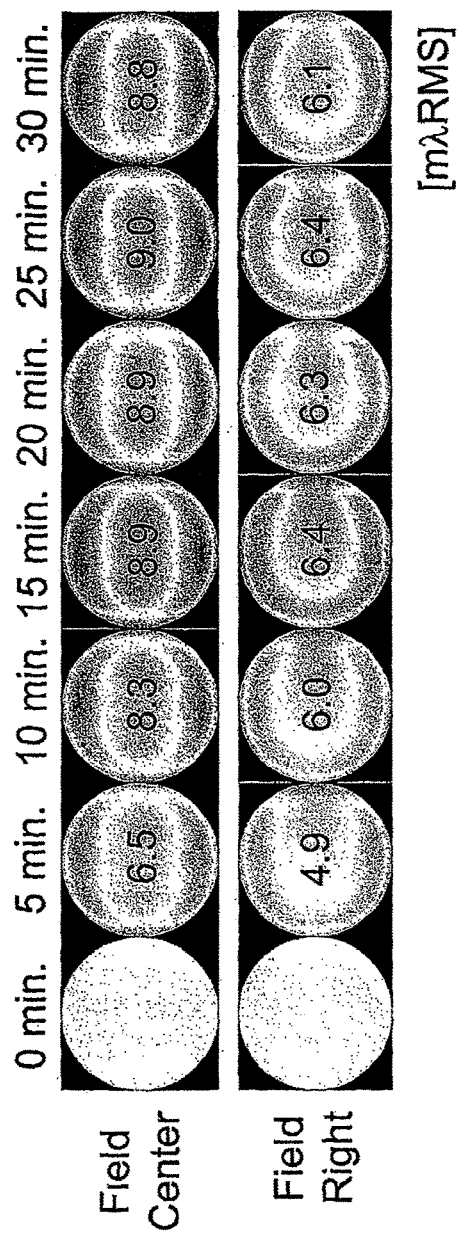
FIG. 4a shows thermal aberrations of imaging lens which may be taken into account in the modeling technique in accordance with the invention.

FIG. 4a shows thermal aberration of a projection lens which may be taken into account in the model in accordance with the invention. As shown in FIG. 4a, the image field center and filed right show different non-uniform distributions of the thermal aberration. For example, the field center at 30 minutes is 8.8 mλ RMS; whereas, the field right at 30 minutes is 6.1 mλ RMS. These variations may be taken into account in the modeling technique of the present invention.

Figure 4B:
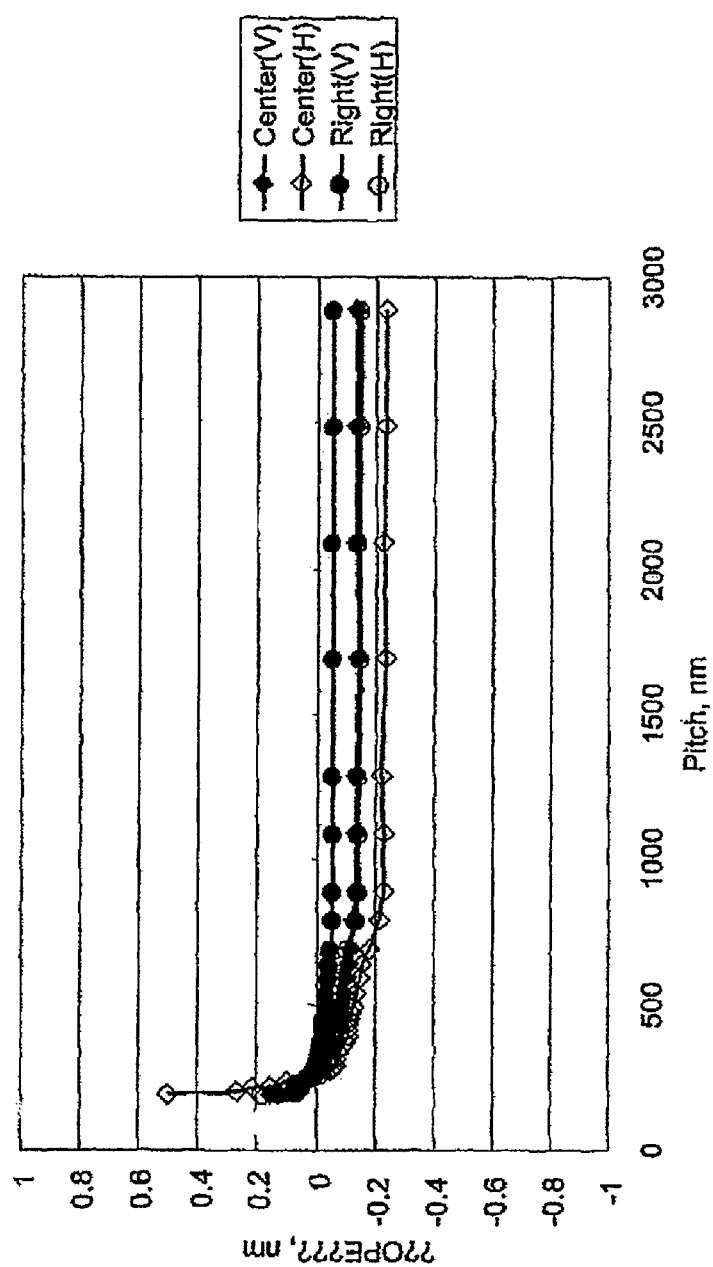
FIG. 4b graphically shows the effect of thermal aberration to OPE using a 90 nm line.

FIG. 4b graphically shows the effect of thermal aberration to OPE, using a 90 nm line. In the graph of FIG. 4b, the y-axis or ordinate is the impact of thermal aberration on OPE and the x-axis or abscissa is pitch in nanometers. More specifically, FIG. 4b shows the image size delta driven by the thermal aberration between zero minutes and 30 minutes for a variety of pitches.

Figure 5:
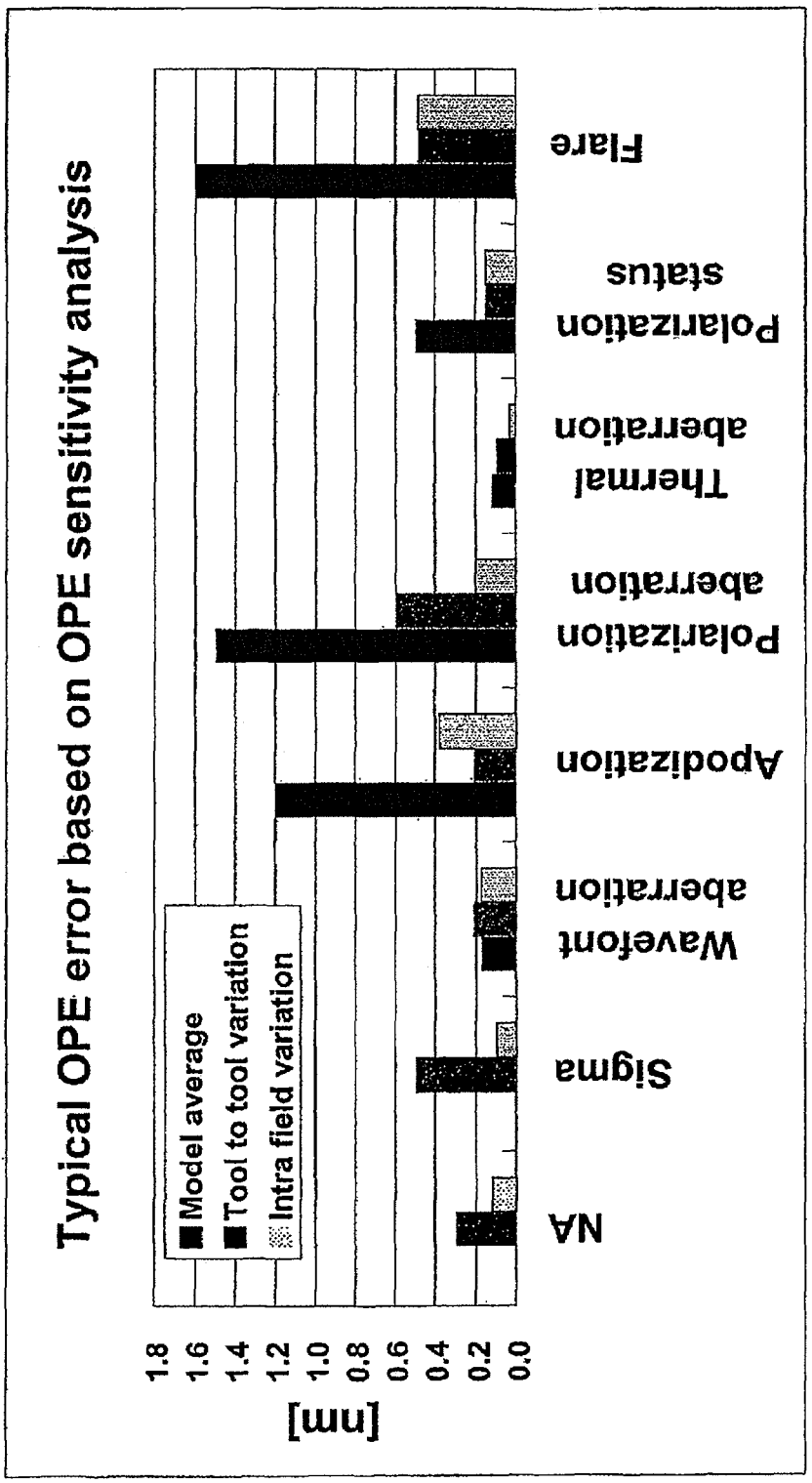
FIG. 5 shows a graph of tool parameter sensitivity to OPE which may be used in implementing aspects of the invention.

FIG. 5 shows a graph of OPE sensitivity to imaging tool signatures in accordance with the invention. More specifically, the graph of FIG. 5 shows a typical OPE based on an OPE sensitivity analysis. In FIG. 5, sensitivity to OPE was analyzed for the following parameters: NA, Sigma, wavefront aberration, apodization, polarization aberration, thermal aberration, illuminator polarization status and flare. These impacts show an OPE range of over a 1.8 nm. In the illustrative graph of FIG. 5, the tool (photolithography apparatus) has been found to be most sensitive to apodization, polarization aberration and flare, each of which may be used as inputs into the modeling technique of the present invention. It is noted that for different patterns, the scale of OPE sensitivities to tool parameters might be different.

Those of skill in the art will appreciate that the tool sensitivity analysis shown by the graph of FIG. 5 can be performed prior to inputting the parameters into the modeling of the present invention. The tool sensitivity analysis can also be used with any parameters associated with the lens signature or other tool parameters of any tool or generation of tools (assuming that each tool in the generation will provide the same or substantially same results). By performing the tool sensitivity analysis prior to inputting the parameters into the modeling, it is possible to determine the impact of the parameters on the tool. And, by knowing which parameters impact tool performance, it is possible to limit the inputs to the modeling of the present invention to those parameters.

Exemplary Processes in Accordance with the Invention

Figure 6:
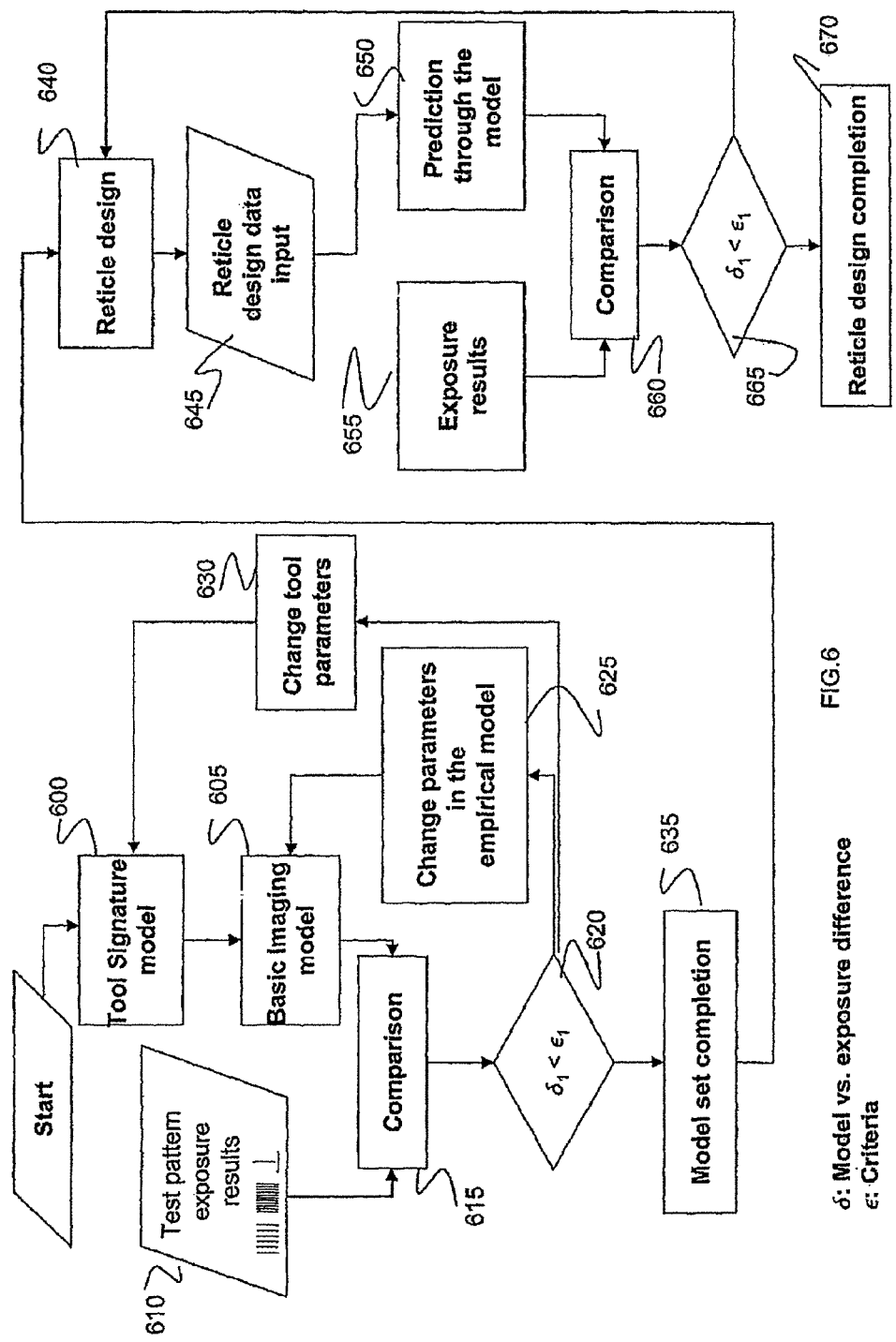
FIG. 6 shows a flow diagram implementing processes in accordance with embodiments of the invention.

FIG. 6 is a flow diagram showing processing steps of embodiments of the invention. More specifically, FIG. 6 shows imaging model set up and integrated circuit (IC) design processes, including OPC and OPC verification in accordance with the invention. Even more specifically, steps 600 through 635 show imaging model set up processes in accordance with the invention; whereas, steps 640 through 670 show IC design including OPC and OPC verification in accordance with the invention. The OPC set up processes and software, and OPC verification can be implemented in Electronic Design Automation (EDA) tools or electronic computer-aided design tools (ECAD) to more accurately model and to verify a reticle design in accordance with the invention, compared to conventional modeling and verification techniques.

FIG. 6 may equally represent a high-level block diagram of components of the invention implementing the steps thereof. The steps of FIG. 6 may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). The invention can take the form of an entirely hardware embodiment or an embodiment containing both hardware and software elements (any of which is referred generally as "control program"). The hardware and software elements include a computer infrastructure configured to implement the functionality of the present invention. The invention can also take the form of a computer program product accessible from a computer-usable or computer-readable medium providing program code for use by or in connection with a computer or any instruction execution system.

At step 600, the tool parameters are input into the model. The tool parameters, for example, may be of the illustrative photolithography apparatus shown in FIG. 10. This will provide a reticle design layout for the specific tool disclosed herein, for example. More specifically, the parameters (data) can include: (i) illuminator details; (ii) lens signature as defined in terms of Jones Matrix Map representing lens signature; (iii) local and global flare data; (iv) longitudinal chromatic aberrations; (v) Illuminator spectrum; and (iv) transverse and longitudinal synchronization errors. Of course and as discussed herein, additional or alternative combinations of parameters may be input into the model. These other parameters include, for example, (i) NA error; (ii) Sigma error; and/or (iii) thermal aberration. Prior to inputting the tool parameters, an OPE sensitivity analysis can be conducted in order to determine which tool parameters should preferably be used in the model.

At step 605, basic model parameters are input into the model. The basic model parameters include reticle solutions such as used in previous generations as discussed with reference to FIG. 1, any and all of which are not exactly predictive of the behavior of the tool. For example, the basic model parameters include generic test reticle data, illuminator data, numerical aperture data, feature biasing data and non-printable sub-resolution assist features, (SRAF). Using the parameters of steps 600 and 605, a simulated, corrected reticle design is generated, which is representative of a reticle design used to provide a target layout for imaging ground rules of an intended design.

At step 610, a test pattern is made using a generic test reticle data. The test pattern can include any combination of features such as, for example, parallel lines, perpendicular lines, and lines of different spacing and/or dimensions. At step 615, the image of the test patterns is compared against the simulated corrected reticle imaging predictions based on the OPC model, e.g., expected wafer image as generated by the model. By way of one illustrative non-limiting example, a 100 nm reticle line using a test reticle is expected to image as an 80 nm line. This 80 nm line can be compared against the image expected from the simulated reticle model.

At step 620, a determination is made as to whether $\delta_1 < \epsilon_1$. $\delta_1$ represents the model vs. exposure difference and $\epsilon_1$ represents predetermined criteria. The predetermined criteria may be, for example, the desired accuracy of the model such as the limit of errors a designer would allow for the model. If $\delta_1 > \epsilon_1$, the basic model parameters can be changed at step 625 and input into the model at step 605. Alternatively or additionally, the tool parameters can be changed at step 630 and input into the model at step 600. The changes to the tool parameters can advantageously be used to eliminate a number of iterations previously required in conventional systems. The steps 600, 605, 610, 620, 625 and 630 are repeated until $\delta_1 < \epsilon_1$.

Once $\delta_1 < \epsilon_1$, the model set is completed at step 635. More specifically, as the model set is completed it is now possible to predict ground rules of the imaging tool and hence more accurately predict how the image will be formed using the tool. Thus, in this way, as the model set is complete, the set up parameters of the model are now known and can be used for the design of the reticle.

At step 640, a reticle design representing intended IC layout is provided; that is, a pattern on a glass that should present a design is provided to the tool. More specifically, at step 645, reticle design data is input into the OPC tool. The reticle design data includes a set of numbers that represents the design of the layouts to be imaged. The output of step 645 is a layout of reticle with OPCs made accordingly to the model set in step 635. At step 650, a prediction of OPC'ed reticle imaging is made through the model and at step 655 the exposure results of the reticle design are provided. The prediction made through the model and the exposure results are compared at step 660. At step 665, if $\delta_2 < \epsilon_2$, the reticle design is complete. However, if $\delta_2 > \delta_2$, the process will return to step 640, where the reticle has to be re-designed and the IC layout patterns have to be corrected. It should be understood that $\delta_2 < \epsilon_2$ can be different from $\delta_1 < \epsilon_1$, as the criteria used during model set up (steps 600-635) and design verification (steps 640-670) may be different. However, $\delta_2 < \epsilon_2$ and $\delta_1 < \epsilon_1$ play a similar role.

Exemplary Implementation Using the Processes in Accordance with the Invention The present invention may be implemented using Scanner Signature Files (SSF) used for scanner-based optical proximity correction (OPC). In implementation, the scanner signature data impacting image OPE will be extracted from the SSF and used in the model of the present invention. These scanner signatures will include a set of parameters and data sets quantifying different scanner characteristics impacting image formation as described in detail herein. In embodiments, there is a single SSF for each scanner model or scanner type. The information contained in the SSF is typically confidential and is thus provided to the EDA solution provider in encrypted form.

As discussed herein, in embodiments, the SSF will include versions based on design values and versions based on design data and some metrology results. The purpose of versions based on design values is to provide a SSF template to guide integration of the scanner signature data with OPC and OPC verification software. The versions based on design data and some metrology results represent early assessment of scanner impacts to be integrated with the OPC software. These versions also represent field independent scanner impacts. Therefore, all scanner-driven adjustments to the OPC models extracted from these versions should be applied uniformly across the entire image field. A summary of data included in these file versions is outlined in Table 1, below, and previously discussed herein.

TABLE 1

| Subsystem | Data Type/OPE Impact | Data |
|---|---|---|
| Illuminator | Polarization | Polarization grid map, and width of azimuthal exclusion zone |
| Lens | Vectorial Aberrations | Jones matrix grid map |
| | Global flare | GF |
| | Local Flare | Flare PSD a and b |
| | Longitudinal Chromatic Aberrations | $CA_z$ |
| Laser | Illuminator Spectrum | Spectrum $\gamma_G$, $\gamma_L$ |
| Stage | Transverse Synchronization Errors | MSD-X and MSD-Y |
| | Longitudinal Synchronization Errors | MSD-Z |

Two sets of scanner impacts can be estimated from the data in the SSF: imaging setup-specific (imaging ID-specific) and scanner model- or scanner type-specific. The scanner setup ID is one element in determining the adjustments to the OPC models. The ID-specific scanner data is scanner illuminator signature, combining pupil distribution of illuminator field and illuminator polarization map.

File Header

The SSF file header contains basic, archiving data provided in any known format. Under respective labels, the SSF header can contain information on:
scanner body type,
SSF version,
date of SSF release,
wavelength (in nm),
refractive index of the medium at the image plane,
scanner magnification,
number of nodes in the grid map data along X and Y coordinates,
number of image field points, and
image field coordinates at which the data were collected.

Illuminator Data

In illustrative embodiments, the illuminator data includes top-hat intensity distribution. In embodiments, the ID-specific, polarized illuminator signatures can be created from the illuminator setup specifications, illuminator polarization grid maps and instructions or formula specifying intensity distributions across illuminator layout. The SSF includes these polarization grid maps necessary to generate the ID-specific illuminator signatures.

In the SSF there will be polarized illuminator grid map for azimuthal polarization and, depending on the scanner body type, polarized illuminator grid maps for V-polarized and H-polarized illuminators. In one illustrative example, the azimuthal polarization illuminator grid map contained in the SSF has the following exemplary format:

[Azimuthally polarized illuminator]
| | | | | | |
|---|---|---|---|---|---|
| −1.000000 | −1.000000 | 0.000000 | 0.000000 | 0.000000 | 0.000000 |
| −1.000000 | −0.984375 | 0.000000 | 0.000000 | 0.000000 | 0.000000 |
| −1.000000 | −0.968750 | 0.000000 | 0.000000 | 0.000000 | 0.000000 |
| ... | | | | | |
| 0.906250 | −0.140625 | 0.794697 | 1.000000 | 78.746805 | 93.333764 |
| 0.906250 | −0.125000 | 0.812689 | 1.000000 | 79.190948 | 93.451483 |
| 0.906250 | −0.109375 | 0.824535 | 0.999999 | 79.592372 | 92.296603 |
| 0.906250 | −0.093750 | 0.827760 | 0.999997 | 79.842081 | 93.570158 |
| 0.906250 | −0.078125 | 0.847249 | 1.000000 | 80.091193 | 93.678275 |
| ... | | | | | |
| 1.000000 | 0.968750 | 0.000000 | 0.000000 | 0.000000 | 0.000000 |
| 1.000000 | 0.984375 | 0.000000 | 0.000000 | 0.000000 | 0.000000 |

-continued

| 1.000000 | 1.000000 | 0.000000 | 0.000000 | 0.000000 | 0.000000 |

[End azimuthally polarized illuminator]

The polarization data starts after "[Azimuthally polarized illuminator]" and runs to "[End azimuthally polarized illuminator]" labels (or its equivalents). Each row of data represents a single point of the illuminator grid map. The numbers in each row specify the location in the pupil grid in sigma units ($S_x$, and $S_y$), followed by illuminator field amplitude, degree of polarization, polarization orientation and phase shift between X and Y polarization components.

Following the "[End azimuthally polarized illuminator]" label, the following data may be included:

[Azimuthal exclusion width]
ExAzim
[End azimuthal exclusion width]

Here, ExAzim is the width of the diagonal exclusion zone of segmented annular illuminator given in degrees.

If V- and H-polarized illuminator polarization grid maps are included in the SSF, their format can be analogous to the azimuthal grid map format except that the labels at the top and the bottom of the data block will be replaced by [V polarized illuminator] or [H polarized illuminator] and [End V polarized illuminator] or [End H polarized illuminator] (or its equivalents) respectively, for example. If V- and H-polarized data are not included in the SSF, the respective data segments will have the following exemplary form:

[V polarized illuminator]
[End V polarized illuminator]
and
[H polarized illuminator]
[End H polarized illuminator].

The polarized illuminator data is collected at the numerical aperture specified in the file header. In the polarized illuminator grid map data sets, the grid point coordinates, the degree of polarization, and the illuminator field amplitude are unitless, while the polarization orientation angle and the phase shift between X and Y polarization components are in degrees.

ID-specific illumination data may be generated in the following exemplary manner.

(i) Each illuminator pupil grid point is defined by 6 numbers such as 0.906250-0.140625 0.794697 1.000000 78.746805 93.333764. Of these, for example, 0.906250-0.140625 are ($S_x$, $S_y$) coordinates of the grid map node, 0.794697 is the illuminator field amplitude E at that node, 1.000000 represents degree of polarization P, 78.746805 is the polarization vector azimuth α, □ and 93.333764 is the phase shift Φ between $E_x$ and $E_y$ field amplitude components (α and Φ □ are in degrees).

(ii) For ($S_x$, $S_y$) illuminator grid point, the two $E_x$ and $E_y$ polarization components of E can be expressed as:

$$E_x = (E \cos \alpha) \exp(-i(\omega t - kr)) \quad (1)$$

$$E_y = (E \sin \alpha) \exp(-i(\omega t - kr + \pi * \Phi/180)) \quad (2)$$

P degree of polarization indicates that at ($S_x$, $S_y$) coordinates, in addition to $E_x$ and $E_y$, there is (1-P) intensity incoherent to E. The (1-P) fraction of incoherent intensity should be treated as unpolarized power present at ($S_x$, $S_y$) illuminator coordinates, contributing to image formation.

Illuminator Polarization Options

Each scanner setup ID specifies the exposure conditions, including lens NA, illuminator type and illuminator polarization. Possible illuminator types include conventional, small sigma and off-axis illuminators. Among off-axis illuminators, the setup IDs specify annular and multi-pole designs. Table 2 represents polarization options of various illuminator types.

TABLE 2

|  | Unpolarized | Azimuthal | V-Polarized | H-Polarized |
|---|---|---|---|---|
| Conventional | ✓ |  | ✓ | ✓ |
| Small-sigma | ✓ |  | ✓ | ✓ |
| Annular | ✓ | ✓ |  |  |
| Quadrupole | ✓ |  |  |  |
| C-Quadrupole | ✓ | ✓ |  |  |
| Dipole-X[1] | ✓ | ✓ | ✓ |  |
| Dipole-Y[1] | ✓ | ✓ |  | ✓ |

[1]V, H or azimuthal polarization of dipole illuminators is set up on the scanner based on its actual capabilities determined by the scanner model and its installed options.

As shown in Table 2, conventional and small-sigma illuminators are either unpolarized or V- or H-polarized. Off-axis illuminators, annular, C-quadruple and dipole, are either unpolarized or azimuthally polarized. Quadrupole illuminators are unpolarized.

Unpolarized Illuminators

Unpolarized illuminator data should be generated as illumination distributions maps specified by the illuminator layouts determined by the scanner setup ID. In these cases, two orthogonal, incoherent illuminator fields should be generated at each illuminator grid point.

Polarized Illuminator Signatures

When setup ID calls for azimuthal, V- or H-polarized illuminator, the appropriate illuminator polarization grid map data, contained in the SSF should be used to generate scanner polarization signature. This can be accomplished by "masking" the appropriate illuminator grid map to the layout specified by the imaging setup ID. Masking of the illuminator layout is akin to imposing a transparent mask of the shape specified by the scanner setup ID on the appropriate polarization grid map.

Multipole Illuminators

The poles in a multipole illuminators can have different shapes such as, for example, are bun-shaped. These bun-shapes can be represented as follows:

Parameters: (2a)

$\sigma_{in}$: The Nearest Point $\sigma_{out}$: The Farthest Point $\phi$: Open Aperture Angle.

$\theta'$: Rotation Angle.

$n$: segments

Polar Coordinate System ($r$, $\theta$)

$$r^2 + R_1^2 - 2rR_1 \cos\left[2\frac{\theta - \theta'}{\phi} \sin^{-1}\left(\frac{R_2}{R_1}\right)\right] \leq R_2^2$$

$$R_1 = \frac{\sigma_{out} + \sigma_{in}}{2} \quad R_2 = \frac{\sigma_{out} - \sigma_{in}}{2}$$

A bun-shape multi-pole illuminator cross section is comprised of all the locations in illuminator pupil with coordinates (r, t) satisfying inequality (2a). Here $\sigma_{in}$ and $\sigma_{out}$ represent the radia of illuminator layout inner and outer edges, ϕ represents the angular width of the pole, θ' represents direction along which the poles are aligned, and n represents the number of poles (segments) in the multipole layout. $R_1$ and $R_2$ represent the location of the pole's center and the pole's width respectively.

Annular Illuminators

Azimuthally polarized annular illuminators typically are comprised of four quadrants separated by exclusion zones, as should be understood by those of skill in the art. In one example, the exclusion zones are each 20 degrees. The ID-specified annular illuminator signatures could be extracted by masking the appropriate illuminator layout from the illuminator polarization grid map contained in the SSF. In one exemplary embodiment, masking off four exclusion zones is provided along the diagonal directions.

Lens Signature Data

Lens aberration content, including apodization and polarization transformations, is represented by pupil grid map of Jones Matrices. This data has the following exemplary format:

```
[Jones matrix]
-1.300000  -1.300000   0.000000  0.000000  0.000000  0.000000  0.000000  0.000000  0.000000  0.000000
-1.300000  -1.279688   0.000000  0.000000  0.000000  0.000000  0.000000  0.000000  0.000000  0.000000
-1.300000  -1.259375   0.000000  0.000000  0.000000  0.000000  0.000000  0.000000  0.000000  0.000000
-1.300000  -1.239062   0.000000  0.000000  0.000000  0.000000  0.000000  0.000000  0.000000  0.000000
.
.
.
 1.300000   1.259375   0.000000  0.000000  0.000000  0.000000  0.000000  0.000000  0.000000  0.000000
 1.300000   1.279688   0.000000  0.000000  0.000000  0.000000  0.000000  0.000000  0.000000  0.000000
 1.300000   1.300000   0.000000  0.000000  0.000000  0.000000  0.000000  0.000000  0.000000  0.000000
[End Jones matrix]
```

In embodiments, the data starts after "[Jones matrix]" and runs to "[End Jones matrix]" labels (or its equivalents). Each row of data represents one grid point of the pupil Jones Matrix Map. The first two numbers in each row ($NA_x$ and $NA_y$) specify the location in the pupil grid in NA units, followed by the real and imaginary parts of Jones Matrix coefficients Jxx, Jxy, Jyx, and Jyy. Therefore, each line of data contains the following information: $NA_x$, $NA_y$, Re(Jxx), Im(Jxx), Re(Jxy), Im(Jxy), Re(Jyx), Im(Jyx), Re(Jyy), and Im(Jyy). The Jones matrix coefficients are unitless.

Lens Chromatic Aberration Data

The impact of chromatic aberrations on imaging is driven by the finite spectral bandwidth of the laser irradiating scanner illuminator. Therefore, the SSF data capturing the impact of chromatic aberrations on imaging can comprise three parameters in the following exemplary format:

[Chromatic Aberrations]

$CA_z$ $\gamma_G$ $\gamma_L$

[End Chromatic Aberrations]

Here, $CA_z$ represents the longitudinal chromatic aberration coefficient and $\gamma_G$ $\gamma_L$ represent the widths of the Gaussian and Lorentzian envelopes of the laser spectrum.

Scanner lens chromatic aberration impact is captured by convolution of the $I_{CA}(z)$ images with the laser spectra in the following manner:

$$I_{CA}(z) = \int I(z - CA_z * \lambda) p_{CA}(\lambda) d\lambda \qquad (3)$$

$$p_{CA}(\lambda) = C_N \frac{\exp\left(-\left(\frac{\lambda}{\gamma_G}\right)^2\right)}{\lambda^2 + \gamma_L^2} \qquad (4)$$

$$C_N = \frac{\gamma_L}{\pi * \exp\left(\frac{\gamma_L}{\gamma_G}\right)^2 * \left[1 - \frac{2}{\sqrt{\pi}} \int_0^{\frac{\gamma_L}{\gamma_G}} \exp(-t^2) dt\right]} \qquad (5)$$

Here $I_{CA}(z)$ and $I(z)$ are the images impacted by chromatic aberrations and free of the chromatic aberration impact respectively. $CA_z$ is the longitudinal chromatic aberration coefficient. $CA_z$ is given in nm/nm (unitless). $p_{CA}(\lambda)$ is the laser Gaussian-Lorentzian spectrum envelopes with coefficients in nm, $C_N$ is the spectrum normalization constant. The indefinite integration in the formula (3), extending from plus to minus infinity, should be carried out within finite boundaries large enough to provide sufficient level of accuracy to formula (3).

Flare Data

The data for flare contains three parameters in the SSF:

[Flare]

a b GF

[End flare].

Scanner local flare impact can be captured in the following manner $$I_{LF}(x, y) = \qquad (6)$$
$$I_0(x, y) + 4\pi^2 * \left[ \begin{array}{l} \int\int I_0(x - x_0, y - y_0) PSF(x_0, y_0) dx_0 dy_0 - \\ I_0(x, y) \int\int PSF(x_0, y_0) dx_0 dy_0 \end{array} \right]$$

$$PSF(x_0, y_0) = a * \left[\left(\frac{2NA}{\lambda}\right) * \sqrt{x_o^2 + y_o^2}\right]^b \qquad (7)$$

Here $I_0(x,y)$ and $I_{LF}(x,y)$ are the flare-free images and images impacted by the local flare respectively. PSF(x,y) is flare point spread function determined by a and b, flare wavefront coefficients. "a" has units of inverse $nm^2$ and "b" is unitless. NA and $\lambda$ are the imaging setup numerical aperture and scanner wavelength respectively.

The integration in formula (6) should be carried out in such a way that $\sqrt{x_0^2+y_0^2}$ changes from zero to infinity, or its reasonable approximation.

Global flare is represented as a single parameter expressing its value as percentage of open frame intensity. The global flare impact is represented by the following formula:

$$I_{GF}(x,y) = I(x,y)_{LF}(1-GF/100) + CA * I_{OF} * GF/100 \qquad (8)$$

Here I($\bar{r}$) is the flare-free image, $I_{GF}(\bar{r})$ is the image impacted by the global flare, CA is average reticle clear area, and $I_{OF}$ is open frame intensity. GF, given in percents, is the global flare level. Local and global flare impacts are anisotropic. And, the value of $I_{OF}$ depends on the imaging setup conditions.

Scanner Synchronization Data

The data for synchronization consists of three parameters included in SSF:

[Synchronization]

$\sigma_x$, $\sigma_y$, $\sigma_z$

[End synchronization].

Here $\sigma_x$, $\sigma_y$, $\sigma_z$ is given in nanometers, represent scan synchronization moving standard deviations, MSD-x, MSD-y and MSD-z, in x, y, and y directions respectively.

Scanner synchronization impact is captured by convolving the images with the synchronization error probability distributions in the following manner $$I_{synch}(x) = \int I(x - x_o) p_{synch}(x_o) dx_o \quad (9)$$

$$I_{synch}(y) = \int I(y - y_o) p_{synch}(y_o) dy_o \quad (10)$$

$$I_{synch}(z) = \int I(z - z_o) p_{synch}(z_o) dz_o \quad (11)$$

$$p_{synch}(x) = \frac{\exp(-x^2/2\sigma_x^2)}{\sqrt{2\pi\sigma_x^2}} \quad (12)$$

$$p_{synch}(y) = \frac{\exp(-y^2/2\sigma_y^2)}{\sqrt{2\pi\sigma_y^2}} \quad (13)$$

$$p_{synch}(z) = \frac{\exp(-z^2/2\sigma_z^2)}{\sqrt{2\pi\sigma_z^2}} \quad (14)$$

Here $I_{synch}$ (x,y,z) and I(x,y,z) are the images with and without synchronization errors respectively, $p_{synch}$ (x,y,z) are the Gaussian probability distributions of the synchronization errors and $\sigma_x$, $\sigma_y$ and $\sigma_z$ are the synchronization moving standard deviations in x, y, and z respectively, all in nm. The indefinite integration in the formulae 9 through 11, extending from plus to minus infinity, should be carried out within finite ranges large enough to provide sufficient level of the formulae accuracy.

The Order of Scanner Impacts

During optical proximity correction, the images should be modified by the scanner impacts in the following order: chromatic aberrations, local flare, global flare, and synchronization.

Figure 7:
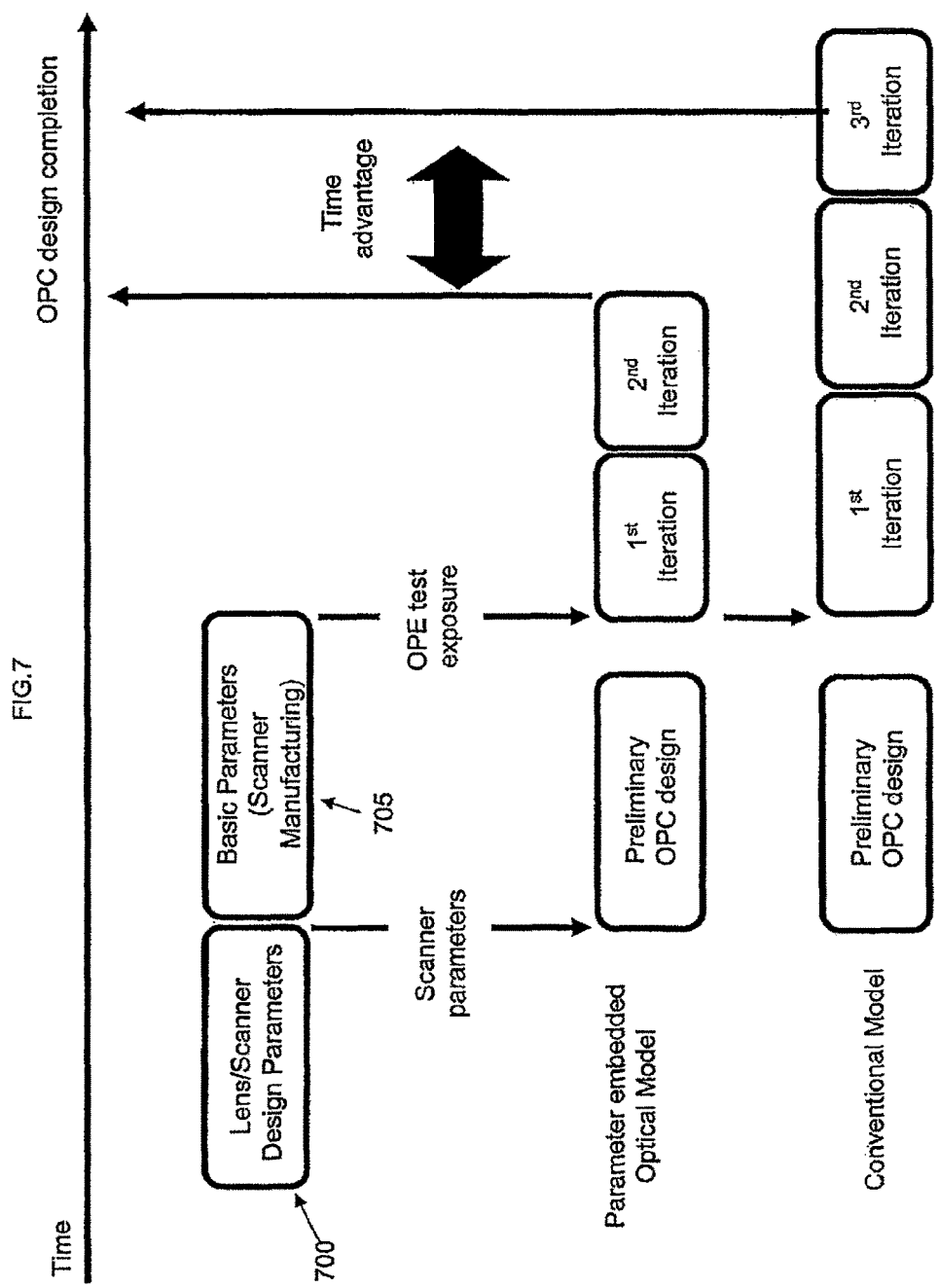
FIG. 7 shows a time advantage of using the optical model technique implemented in accordance with the invention for an OPC design of a new scanner.

Exemplary Advantages of Implementing the Processes in Accordance with the Invention FIG. 7 shows the time advantage of using the modeling technique implemented in accordance with the invention for an OPC design of a new scanner before it become available for manufacture. In FIG. 7, the parameters considered in the modeling technique of the present invention includes the lens and tool parameters 700, in addition to the basic parameters 705. By using the lens and tool parameters 700, only two iterations are necessary for OPC design completion, compared to three (or more) iterations for a conventional modeling system. This provides a time advantage to the OPC design completion.

Figure 8:
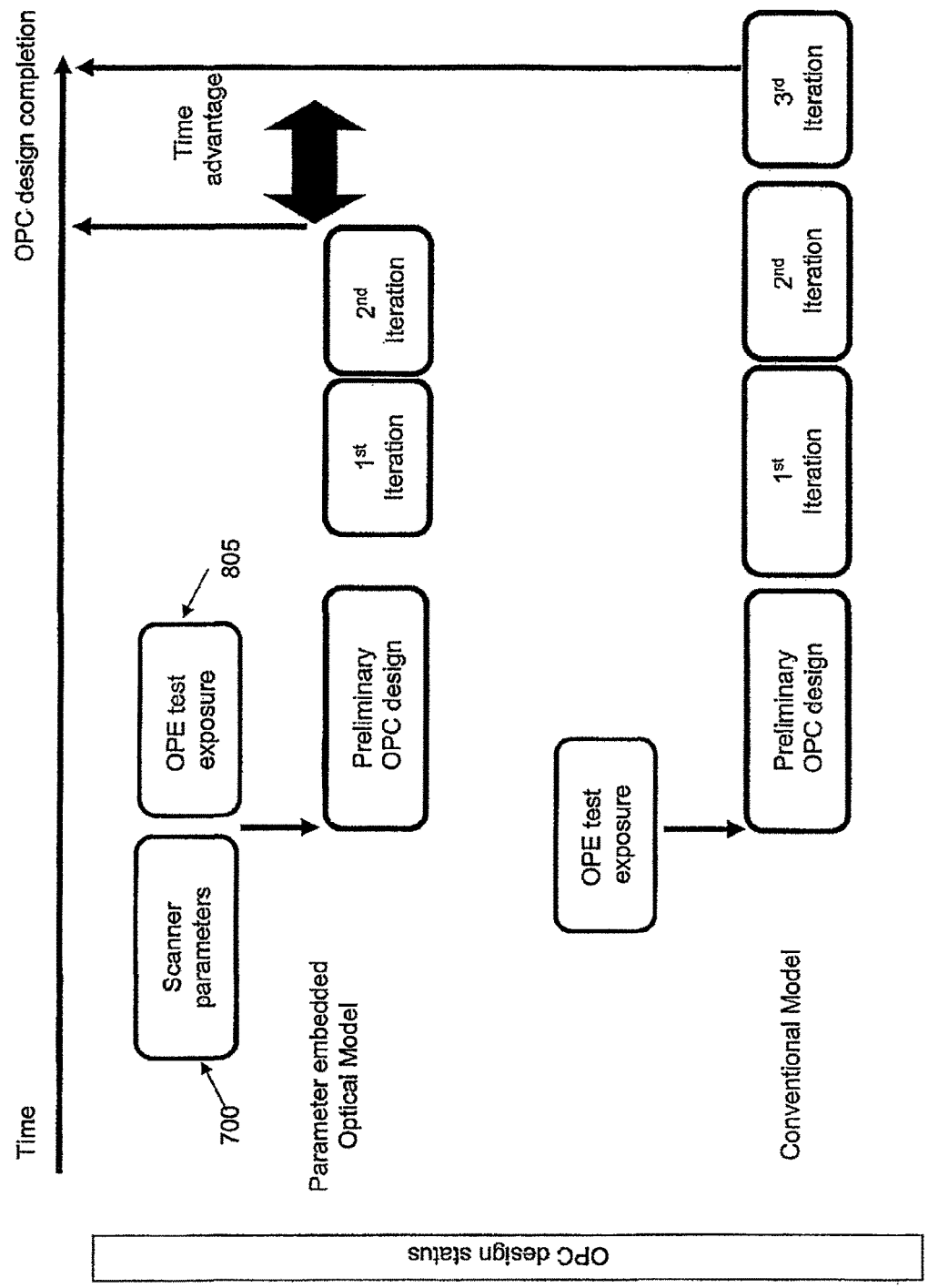
FIG. 8 shows the time advantage of using the optical model technique implemented in accordance with the invention for an OPC design for a new device.

FIG. 8 shows the time advantage of using the modeling technique implemented in accordance with the invention for an OPC design of a new device to be manufactured on established imaging tools. In FIG. 8, the parameters considered in the modeling of the present invention include the lens and tool parameters 700, in addition to the optical proximity effect (OPE) test exposure (basic modeling parameters) 805. As discussed above, the use of the lens and tool parameters 700 provides a more robust predictive model, thereby reducing the number of iterations needed to design a reticle for a particular image layout. As such, by using the lens and tool parameters 400, only two iterations are necessary for OPC design completion, compared to three (or more) iterations for a conventional modeling system.

Figure 9:
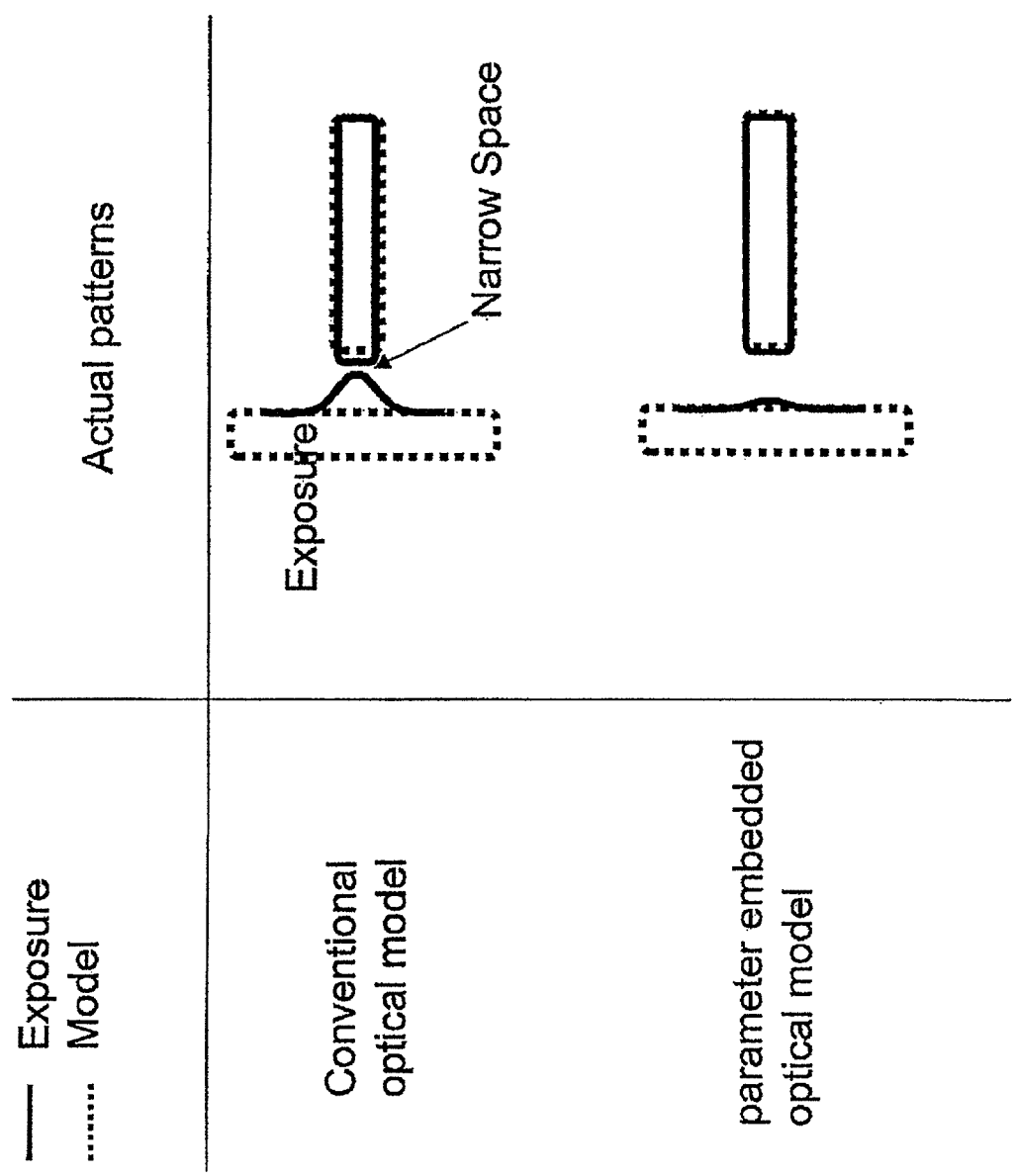
FIG. 9 shows a comparison of impacts of a conventional optical model versus an optical model implemented in accordance with the invention.

FIG. 9 shows a comparison of patterns obtained using a reticle manufactured from the conventional optical model versus an optical model implemented in accordance with the invention. More specifically, FIG. 9 shows that a reticle manufactured using a conventional optical model, marked by dash line, produces a T-bar pattern with a narrow space between the bars, marked by solid line, caused by an optical proximity effect (OPE). Such narrow space is driven by T-bar OPE. In this instance the prediction of OPE is incorrect and it precludes control of the separation between the two perpendicular bars of the T-bar feature. In comparison, the scanner parameter embedded optical modeling technique of the present invention accurately corrects OPE. The image of correctly OPC'ed t-bar shows a wide space between perpendicular bars of the T-bar pattern. As such, the pattern created using the reticle from the parameter embedded optical model of the present invention is more accurate in providing desire image than that produced by the conventional optical model. And, by initially having a more accurate image, it is possible to reduce the number of iterations needed to manufacture the reticle used in the imaging process.

The optical proximity effect (OPE) test exposure includes a simulation exposure and an actual exposure. The simulation exposure means that it is implemented just on a computer without an actual exposure by an actual machine.

Exemplary the System Using a Reticle Designed in Accordance with the Invention

Figure 10:
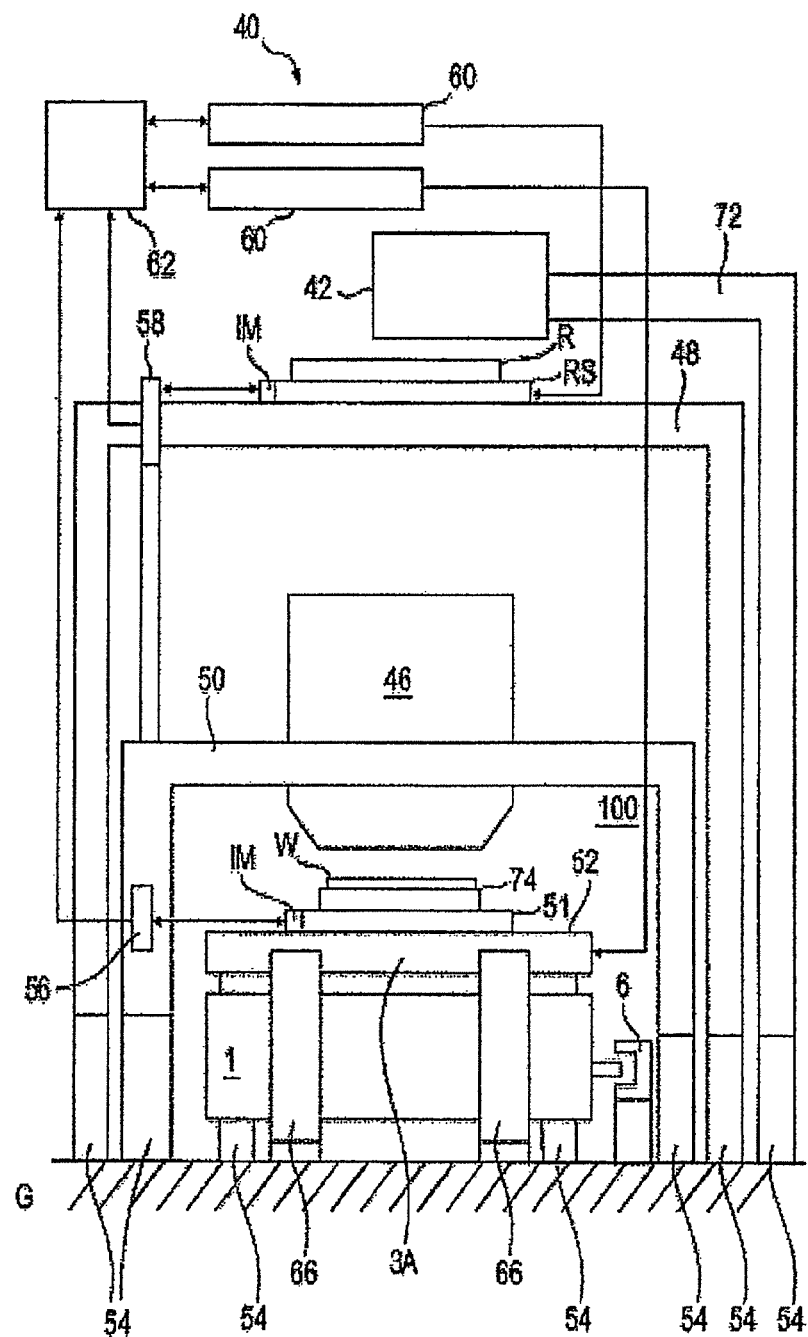
FIG. 10 is a schematic view illustrating a photolithography apparatus according to the invention.

FIG. 10 is a schematic view illustrating a photolithography apparatus (exposure apparatus) 40 in accordance with the present invention. The wafer positioning stage 52 includes a wafer stage 51, a base 1, a following stage 3A, a following stage base 3A, and an additional actuator 6. The wafer stage 51 comprises a wafer chuck 120 that holds a wafer 130 and an interferometer mirror IM. The base 1 is supported by a plurality of isolators 54 (or a reaction frame). The isolator 54 may include a gimbal air bearing 105. The following stage base 3A is supported by a wafer stage frame (reaction frame) 66. The additional actuator 6 is supported on the ground G through a reaction frame 53. The wafer positioning stage 52 is structured so that it can move the wafer stage 51 in multiple (e.g., three to six) degrees of freedom under precision control by a drive control unit 140 and system controller 30, and position and orient the wafer 130 as desired relative to the projection optics 46. In this embodiment, the wafer stage 51 has six degrees of freedom by utilizing the Z direction forces generated by the x motor and the y motor of the wafer positioning stage 52 to control a leveling of the wafer 130. However, a wafer table having three degrees of freedom (Z, θx, θy) or six degrees of freedom can be attached to the wafer stage 51 to control the leveling of the wafer. The wafer table includes the wafer chuck 120, at least three voice coil motors (not shown), and bearing system. The wafer table is levitated in the vertical plane by the voice coil motors and supported on the wafer stage 51 by the bearing system so that the wafer table can move relative to the wafer stage 51.

The reaction force generated by the wafer stage 51 motion in the X direction can be canceled by motion of the base 1 and the additional actuator 6. Further, the reaction force generated by the wafer stage motion in the Y direction can be canceled by the motion of the following stage base 3A.

An illumination system 42 is supported by a frame 72. The illumination system 42 projects radiant energy (e.g., light) through a mask pattern on a reticle R that is supported by and scanned using a reticle stage RS. In one embodiment, the reticle is designed using the modeling techniques of the present invention. The reticle stage RS may have a reticle coarse stage for coarse motion and a reticle fine stage for fine motion. In this case, the reticle coarse stage correspond to the translation stage table 100, with one degree of freedom. The reaction force generated by the motion of the reticle stage RS can be mechanically released to the ground through a reticle stage frame 48 and the isolator 54, in accordance with the structures described in JP Hei 8-330224 and U.S. Pat. No. 5,874,820, the entire contents of which are incorporated by reference herein. The light is focused through a projection optical system (lens assembly) 46 supported on a projection optics frame 75 and released to the ground through isolator 54.

An interferometer 56 is supported on the projection optics frame 75 and detects the position of the wafer stage 51 and outputs the information of the position of the wafer stage 51 to the system controller 30. A second interferometer 58 is supported on the projection optics frame 75 and detects the position of the reticle stage RS and outputs the information of the position to the system controller 30. The system controller 30 controls a drive control unit 140 to position the reticle R at a desired position and orientation relative to the wafer 130 or the projection optics 46. By using the system and method of the present invention, accuracy of the interferometer is maintained.

There are a number of different types of photolithographic devices which can implement the present invention, e.g., j dry and immersion photolithography tools. For example, apparatus 70 may comprise an exposure apparatus that can be used as a scanning type photolithography system, which exposes the pattern from reticle R onto wafer 130 with reticle R and wafer 130 moving synchronously. In a scanning type lithographic device, reticle R is moved perpendicular to an optical axis of projection optics 46 by reticle stage RS and wafer 130 is moved perpendicular to an optical axis of projection optics 46 by wafer positioning stage 52. Scanning of reticle R and wafer 130 occurs while reticle R and wafer 130 are moving synchronously but in opposite directions along mutually parallel axes parallel to the x-axis.

Alternatively, exposure apparatus 70 can be a step-and-repeat type photolithography system that exposes reticle R while reticle R and wafer 130 are stationary. In the step and repeat process, wafer 130 is in a fixed position relative to reticle R and projection optics 46 during the exposure of an individual field. Subsequently, between consecutive exposure steps, wafer 130 is consecutively moved by wafer positioning stage 52 perpendicular to the optical axis of projection optics 46 so that the next field of semiconductor wafer 130 is brought into position relative to projection optics 46 and reticle R for exposure. Following this process, the images on reticle R are sequentially exposed onto the fields of wafer 130 so that the next field of semiconductor wafer 130 is brought into position relative to projection optics 46 and reticle R.

However, the use of apparatus 70 provided herein is not limited to a photolithography system for semiconductor manufacturing. Apparatus 70 (e.g., an exposure apparatus), for example can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

In the illumination system 42, the illumination source can be g-line (436 nm), i-line (365 nm), KrF excimer laser (248 nm), ArF excimer laser (193 nm) or $F_2$ laser (157 nm). Alternatively, the illumination source can also use charged particle beams such as x-rays and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

With respect to projection optics 46, when far ultra-violet rays such as the excimer laser is used, glass materials such as quartz and fluorite that transmit far ultra-violet rays are preferably used. When the $F_2$ type laser or x-rays are used, projection optics 46 should preferably be either catadioptric or refractive (a reticle should also preferably be a reflective type), and when an electron beam is used, electron optics should preferably comprise electron lenses and deflectors. The optical path for the electron beams should be traced in vacuum.

Also, with an exposure device that employs vacuum ultra-violet radiation (VUV) of wavelength 200 nm or shorter, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No. 10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above-mentioned U.S. patents, as well as the Japanese patent applications published in the Office Gazette for Laid-Open Patent Applications are incorporated herein by reference.

Further, in photolithography systems, when linear motors that differ from the motors shown in the above embodiments (see U.S. Pat. Nos. 5,623,853 or 5,528,118) are used in one of a wafer stage or a reticle stage, the linear motors can be either an air levitation type employing air bearings or a magnetic levitation type using Lorentz force or reactance force. Additionally, the stage could move along a guide, or it could be a guideless type stage that uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 11:
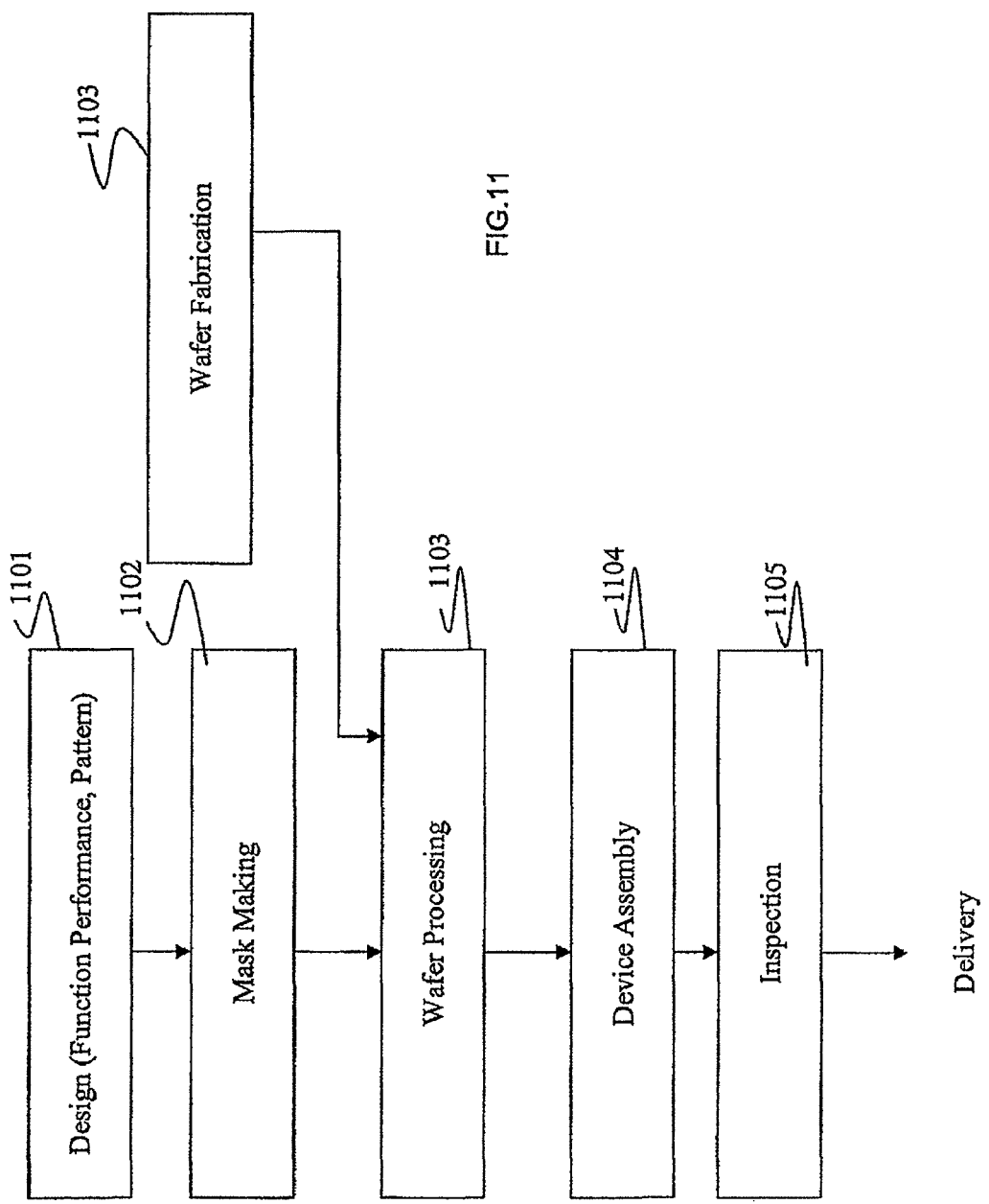
FIG. 11 is a flow chart showing semiconductor device fabrication.

Further, semiconductor devices can be fabricated using the above described systems, by the process shown generally in FIG. 11. In step 1101 the device's function and performance characteristics are designed. Next, in step 1102, a mask (reticle) having a pattern is designed according to the previous designing step, and in a parallel step 1103, a wafer is made from a silicon material. The mask pattern designed in step 1102 is exposed onto the wafer from step 1103 in step 1104 by a photolithography system described hereinabove consistent with the principles of the present invention. In step 1105 the semiconductor device is assembled (including the dicing process, bonding process and packaging process), then finally the device is inspected in step 1106.

Figure 12:
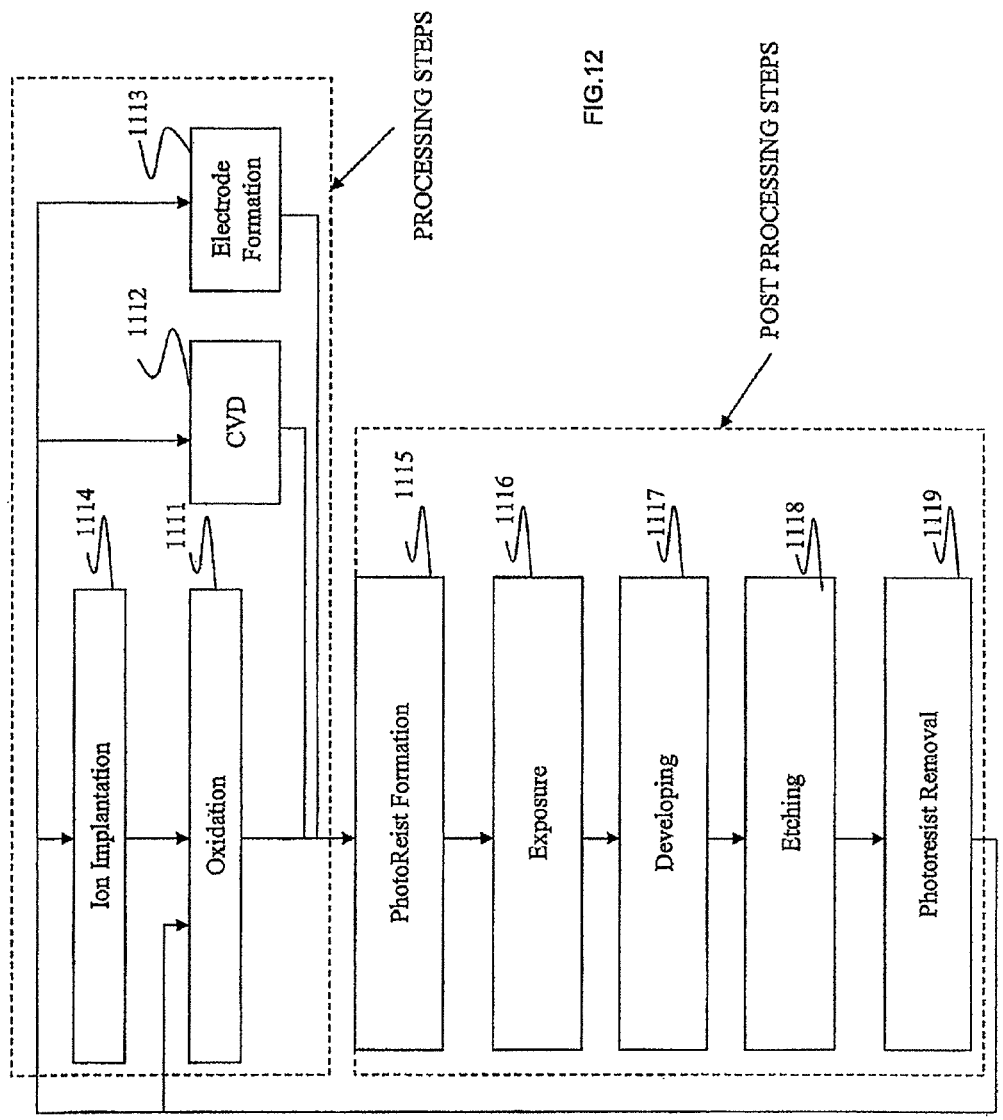
FIG. 12 is a flow chart showing wafer processing.

FIG. 12 illustrates a detailed flowchart example of the above-mentioned step 304 in the case of fabricating semiconductor devices. In step 1111 (oxidation step), the wafer surface is oxidized. In step 1112 (CVD step), an insulation film is formed on the wafer surface. In step 1113 (electrode formation step), electrodes are formed on the wafer by vapor deposition. In step 1114 (ion implantation step), ions are implanted in the wafer. The above-mentioned steps 1111-1114 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially in step 1115 (photoresist formation step), photoresist is applied to a wafer. Next, in step 1116 (exposure step), the above-mentioned exposure apparatus is used to transfer the circuit pattern of a mask (reticle) to a wafer. Then, in step 11317 (developing step), the exposed wafer is developed, and in step 1118 (etching step), parts other than residual photoresist (exposed material surface) are removed by etching. In step 1119 (photoresist removal step), unnecessary photoresist remaining after etching is removed. Multiple circuit patterns are formed by repetition of these pre-processing and post-processing steps.

Additional Exemplary Methods

Figure 13:
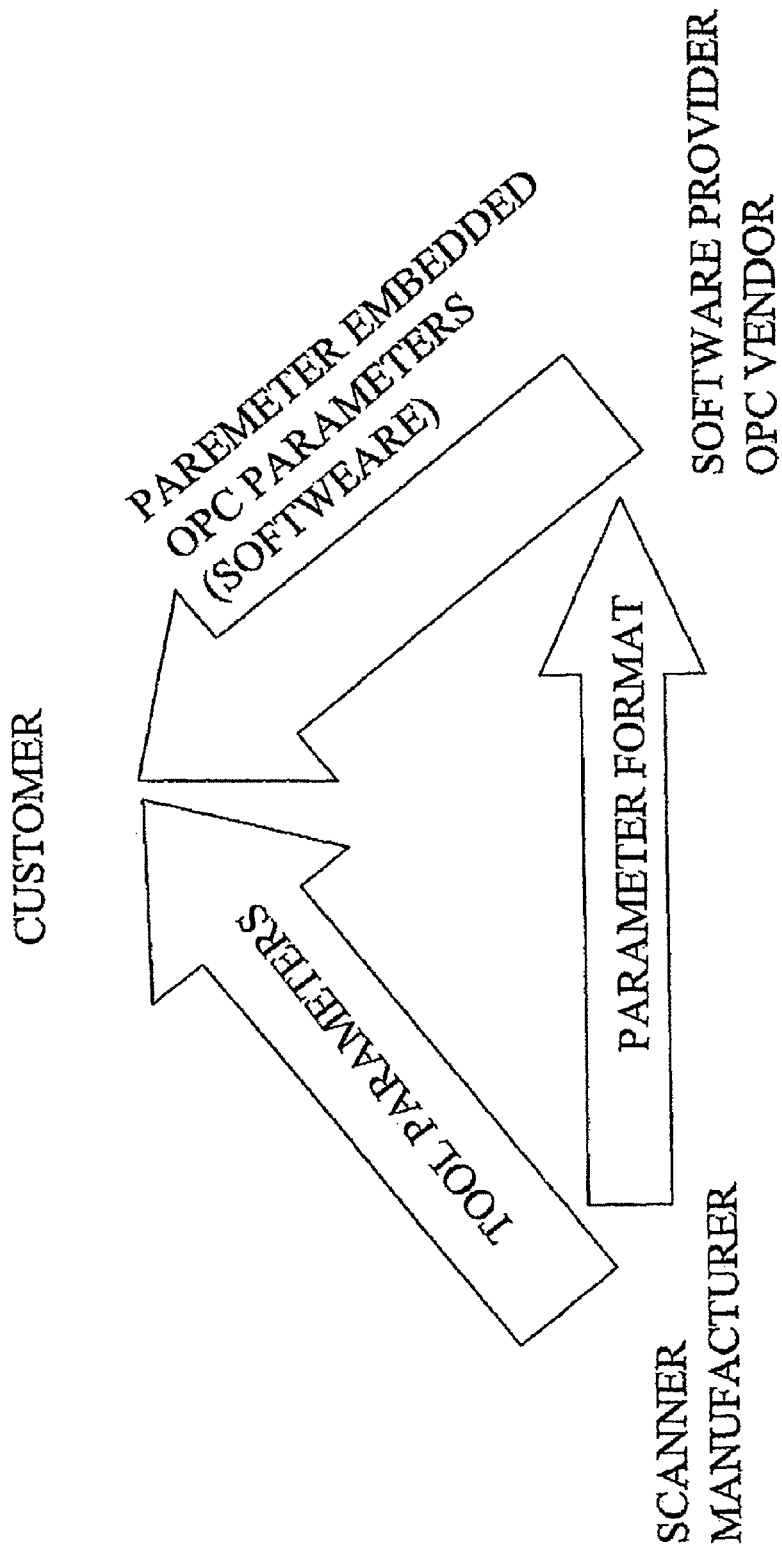
FIG. 13 shows an OPC design process.

As shown in FIG. 13, as a further embodiment, in the OPC design process, the scanner manufacturer provides scanner parameters to a software provider. The software provider, in turn, imports these into the software for making the design of a reticle. The software provider provides the software to a semiconductor device maker for use in the design of reticles. The method can also include the process of encrypting the data at any of the steps. In further embodiments, the scanner manufacturer provides a scanner parameter software file format to the software provider, and provides scanner parameters directly to the semiconductor device maker. The software provider provides the software to the semiconductor device maker. The device maker imports the scanner parameters into the software for use in the design of reticles. Once again, any of the steps can include encryption.

Figure 14:
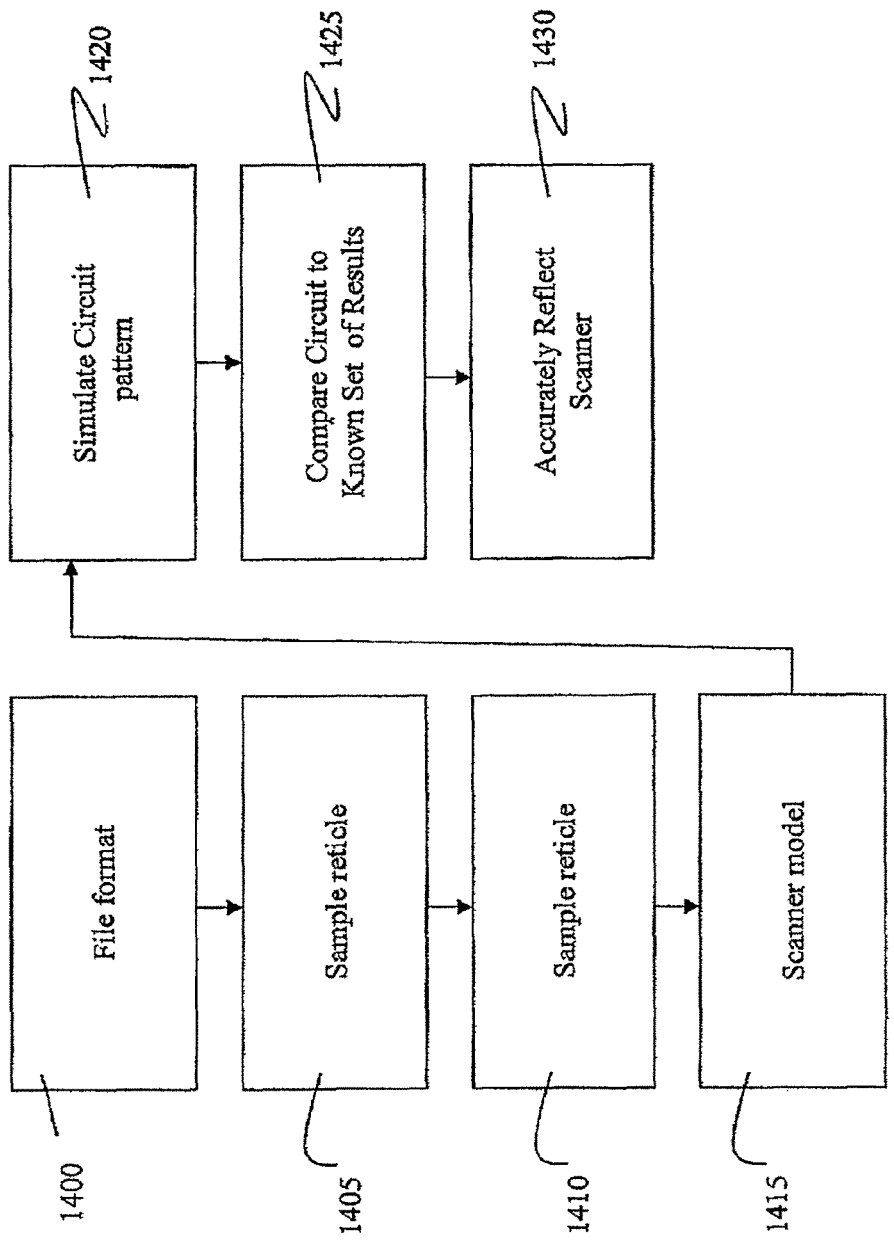
FIG. 14 shows a certification process in accordance with the invention.

In even further embodiments, as shown in FIG. 14, a method is provided for verifying compliance with the scanner parameter file format as described above, and would be used to certify a software provider. For example, the steps may include, at step 1400, providing a software file format to a software provider or user and, at step 1405, providing a set of sample data in the format. At step 1410, a sample reticle pattern is provided to the semiconductor device maker and, using the sample data, a scanner model is generated at step 1415. At step 1420, a resulting circuit pattern is simulated using the scanner model and the sample reticle pattern. At step 1425, simulation results are compared to a set of results known to be accurate (either from an accurate simulation, or from actual exposure results) and discrepancies are identified. At step 1430, a determination is made as to whether the software provider accurately represented the scanner.

Although the invention has been particularly discussed in a photolithography system as an exemplary example, the inventive products, methods and systems may be used in other and further contexts, including any applications where it is desired to design a reticle such as precision apparatuses (e.g., photography system). Thus, while the invention has been described in terms of its embodiments, those skilled in the art will recognize that the invention can be practiced with modifications within the spirit and scope of the appended claims. Thus, it is intended that all matter contained in the foregoing description or shown in the accompanying drawings shall be interpreted as illustrative rather than limiting, and the invention should be defined only in accordance with the following claims and their equivalents.

What is claimed is:
1. A method, comprising:
modifying, by a computer, a simulated corrected reticle design using basic model parameters and tool parameters of a predetermined projection tool;

creating, by the computer, reticle design data which represents a design of layouts to be imaged for a semiconductor device;

comparing a prediction based on the reticle design data to exposure results of a reticle design which is based on the simulated corrected reticle design; and creating, by the computer, a completed reticle design based on the comparison.

2. The method of claim 1, further comprising exposing a semiconductor device using a mask set formed from the completed reticle design to form an image of a circuit design on the semiconductor device using the predetermined projection tool.

3. The method of claim 1, further comprising determining the tool parameters by conducting an optical proximity effect (OPE) sensitivity analysis.

4. The method of claim 1, wherein the basic model parameters include at least one of: generic test reticle data; illuminator data; numerical aperture data; feature biasing data; and non-printable sub-resolution assist features (SRAF).

5. The method of claim 1, wherein the predetermined projection tool is a scanner.

6. The method of claim 1, wherein the predetermined projection tool is a full field stepper.

7. The method of claim 1, wherein the tool parameters include one or more of: illuminator details; lens signature as defined in terms of Jones Matrix Map representing lens signature; local and global flare data; longitudinal chromatic aberrations; Illuminator spectrum; and transverse and longitudinal synchronization errors.

8. A computer program product comprising a computer usable medium having readable program code embodied in the medium, that, when executed by a computer, causes the computer program product to perform the steps of:

modifying a simulated corrected reticle design using basic model parameters and tool parameters of a predetermined projection tool;

creating reticle design data which represents a design of layouts to be imaged for a semiconductor device;

comparing a prediction based on the reticle design data to exposure results of a reticle design which is based on the simulated corrected reticle design;

creating a completed reticle design based on the comparison; and creating a mask set for use in manufacturing semiconductor devices based on the completed reticle design.

9. The computer program product of claim 8, wherein the computer usable medium having readable program code embodied in the medium is encrypted.

10. The computer program product of claim 8, wherein the tool parameters include one or more of the following: (i) illuminator details; (ii) lens signature as defined in terms of Jones Matrix Map representing lens signature; (iii) local and global flare data; (iv) longitudinal chromatic aberrations; (v) Illuminator spectrum; and (vi) transverse and longitudinal synchronization errors.

11. The computer program product of claim 10, wherein the tool parameters further include at least one of: (i) NA error; (ii) Sigma error; and (iii) thermal aberration.

12. The computer program product of claim 8, further comprising conducting an optical proximity effect (OPE) sensitivity analysis in order to determine which tool parameters are to be used in the model.

13. A system for deploying an application for creating a mask set, comprising:

a computer operable to:

modify a simulated corrected reticle design using basic model parameters and tool parameters of a predetermined projection tool;

create reticle design data which represents a design of layouts to be imaged for a semiconductor device;

compare a prediction based on the reticle design data to exposure results of a reticle design which is based on the simulated corrected reticle design;

create a completed reticle design based on the comparison; and create the mask set based on the completed reticle design.

14. A method, comprising:

modifying, by the computer, a simulated corrected reticle design using basic model parameters and tool parameters of a predetermined projection tool;

creating, by the computer, reticle design data which represents a design of layouts to be imaged for a semiconductor device;

comparing a prediction based on the reticle design data to exposure results of a reticle design which is based on the simulated corrected reticle design; and creating, by the computer, a completed reticle design based on the comparison, wherein the tool parameters comprise at least one of:

illuminator details;

lens signature as defined in terms of Jones Matrix Map representing lens signature;

local and global flare data;

longitudinal chromatic aberrations;

Illuminator spectrum; and transverse and longitudinal synchronization errors.

15. The method of claim 14, wherein the tool parameters further include at least one of: NA error; Sigma error; and thermal aberration.

16. The method of claim 14, further comprising exposing the semiconductor device using a mask set, formed from the completed reticle design, to form an image of a circuit design on the semiconductor device using the predetermined projection tool.

17. The method of claim 14, further comprising determining the tool parameters by conducting an optical proximity effect (OPE) sensitivity analysis.

18. The method of claim 14, wherein the basic model parameters include at least one of: generic test reticle data; illuminator data; numerical aperture data; feature biasing data; and non-printable sub-resolution assist features (SRAF).

19. The method of claim 14, wherein the predetermined projection tool is a scanner.

20. The method of claim 14, wherein the predetermined projection tool is a full field stepper.

21. The method of claim 14, further comprising determining the tool parameters.

22. The method of claim 14, wherein the illuminator details comprise information about intensity and polarization content of each location in the illumination pupil.

* * * * *